United States Patent
Xie et al.

(10) Patent No.: US 10,332,803 B1
(45) Date of Patent: Jun. 25, 2019

(54) HYBRID GATE-ALL-AROUND (GAA) FIELD EFFECT TRANSISTOR (FET) STRUCTURE AND METHOD OF FORMING

(71) Applicant: GLOBALFOUNDRIES INC., Grand Cayman (KY)

(72) Inventors: Ruilong Xie, Schenectady, NY (US); Edward J. Nowak, Shelburne, VT (US); Bipul C. Paul, Mechanicville, NY (US); Steven R. Soss, Cornwall, NY (US); Julien Frougier, Albany, NY (US); Daniel Chanemougame, Niskayuna, NY (US); Lars W. Liebmann, Mechanicville, NY (US)

(73) Assignee: GLOBALFOUNDARIES INC., Grand Cayman (KY)

( * ) Notice: Subject to any disclaimer, the term of this patent is extended or adjusted under 35 U.S.C. 154(b) by 0 days.

(21) Appl. No.: 15/973,817

(22) Filed: May 8, 2018

(51) Int. Cl.
| | |
|---|---|
| *H01L 21/8238* | (2006.01) |
| *H01L 21/02* | (2006.01) |
| *H01L 29/06* | (2006.01) |
| *H01L 29/423* | (2006.01) |
| *H01L 29/49* | (2006.01) |
| *H01L 29/786* | (2006.01) |
| *H01L 29/66* | (2006.01) |
| *H01L 21/3065* | (2006.01) |

(Continued)

(52) U.S. Cl.
CPC ........... *H01L 21/823807* (2013.01); *H01L 21/02532* (2013.01); *H01L 21/02603* (2013.01); *H01L 21/3065* (2013.01); *H01L 21/3081* (2013.01); *H01L 21/3085* (2013.01); *H01L 21/3086* (2013.01); *H01L 21/823842* (2013.01); *H01L 21/823878* (2013.01); *H01L 27/092* (2013.01); *H01L 29/0649* (2013.01); *H01L 29/0673* (2013.01); *H01L 29/0676* (2013.01); *H01L 29/42392* (2013.01); *H01L 29/4908* (2013.01); *H01L 29/66545* (2013.01); *H01L 29/78651* (2013.01); *H01L 29/78696* (2013.01)

(58) Field of Classification Search
CPC combination set(s) only.
See application file for complete search history.

(56) References Cited

U.S. PATENT DOCUMENTS

| | | | |
|---|---|---|---|
| 9,583,486 B1 * | 2/2017 | Ando | H01L 27/0886 |
| 10,002,939 B1 * | 6/2018 | Cheng | H01L 29/511 |

(Continued)

*Primary Examiner* — Mamadou L Diallo
(74) *Attorney, Agent, or Firm* — Anthony Canale; Hoffman Warnick

(57) ABSTRACT

Various embodiments relate to gate-all-around (GAA) transistors and methods of forming such transistors. In some embodiments, a method performed on a precursor structure includes selectively removing a sacrificial nanosheet to open a vertical gap between a pair of semiconductor nanosheets; forming a first work function metal to surround the precursor nanosheet stack and fin, the first work function metal filling the vertical gap between the pair of semiconductor nano sheets; selectively removing first work function metal surrounding the fin while preserving an entirety of first work function metal surrounding the nanosheet stack; and forming a second work function metal: over a remaining portion of the first work function metal on nanosheet stack, and surrounding the fin, where first work function metal includes a different material than second work function metal.

20 Claims, 23 Drawing Sheets

(51) Int. Cl.
*H01L 21/308* (2006.01)
*H01L 27/092* (2006.01)

(56) References Cited

U.S. PATENT DOCUMENTS

| | | |
|---|---|---|
| 2016/0141423 A1 | 5/2016 | Diaz et al. |
| 2017/0133459 A1* | 5/2017 | Pranatharthiharan ........................ H01L 29/0649 |
| 2017/0207324 A1 | 7/2017 | Huang |
| 2017/0330801 A1* | 11/2017 | Ragnarsson ........ H01L 21/0214 |

* cited by examiner

HYBRID GATE-ALL-AROUND (GAA) FIELD EFFECT TRANSISTOR (FET) STRUCTURE AND METHOD OF FORMING

BACKGROUND

Technical Field

The present disclosure relates to integrated circuit (IC) manufacture. More particularly, the disclosure relates to forming gate-all-around (GAA) transistors using selective patterning techniques to enhance reliability and improve manufacturability.

Related Art

Advanced manufacturing of ICs requires formation of individual circuit elements, e.g., transistors such as field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. Transistors may be formed over a substrate and may be electrically isolated with an insulating dielectric layer, e.g., inter-level dielectric (ILD) layer. Contacts may be formed to each of the source, drain, and gate regions through the dielectric layer in order to provide electrical connection between the transistors and other circuit elements that may be formed subsequent to the transistor in other metal levels.

Fin-type field effect transistors ("FinFETs") have become increasingly widespread because FinFETs offer better electrostatic control over the behavior in the channel than planar FETs. FinFETs are formed by creating a number of semiconductor fins on a substrate and placing a gate conductor perpendicularly across the fins. A FinFET is created by the gate forming a channel region below the gate in the fin, and source/drain regions formed in the fin aside the gate. Continued development of transistor architectures has yielded dimensional improvements to FET technology, such as "gate all around" (GAA) device architectures.

GAA transistors provide a structure similar to a FinFET in which the work function metal wraps completely around a semiconductor channel material within a two dimensional space. GAA transistors may be preferable where significantly reduced gate lengths are required in a circuit design. GAA transistors may provide a higher amount of contact area between the work function metal and the semiconductor channel as compared to conventional devices. However, GAA transistors are more difficult to form than FinFET transistors and may have competing constraints.

GAA transistors can be formed as vertical (vGAA) devices or horizontal (hGAA) devices. The vGAA devices are commonly formed with sets of vertically oriented, horizontally separated fins. The hGAA devices are commonly formed with a nanosheet stack including horizontally oriented, vertically spaced nanosheets. Conventionally, adjacent pFET and nFET structures are fabricated as a single type of GAA device, such as two adjacent hGAA devices or vGAA devices. In particular hGAA devices employing nanosheet stacks are becoming more prevalent as FETs continue to scale downward. However, it is becoming more difficult to precisely place a boundary between adjacent hGAA devices as these devices reduce in size, thereby reducing manufacturability and device reliability.

SUMMARY

All examples and features mentioned below can be combined in any technically possible way.

Various embodiments of the disclosure include methods of forming a transistor structure such as a gate-all-around (GAA) transistor structure. Various additional embodiments of the disclosure include transistor structures, such as GAA transistor structures, formed according to the disclosed methods.

In a first particular embodiment, a method includes: fabricating a field effect transistor (FET) from a precursor structure including: a nanosheet stack positioned over a substrate between a first source terminal and a first drain terminal, the nanosheet stack including at least one pair of horizontally oriented semiconductor nanosheets vertically separated by a sacrificial nanosheet; and at least one fin positioned over the substrate between a second source terminal and a second drain terminal, wherein the at least one fin is vertically oriented and horizontally separated from the nanosheet stack, wherein the fabricating includes: selectively removing the sacrificial nanosheet to open a vertical gap between the at least one pair of semiconductor nanosheets; forming a first work function metal to surround the nanosheet stack and the at least one fin, the first work function metal filling the vertical gap between the at least one pair of semiconductor nanosheets; selectively removing the first work function metal surrounding the at least one fin while preserving an entirety of the first work function metal surrounding the nano sheet stack; and forming a second work function metal: over a remaining portion of the first work function metal on the nanosheet stack, and surrounding the at least one fin, wherein the first work function metal includes a different material than the second work function metal.

In a second particular embodiment, a transistor structure includes: a nanosheet stack positioned over a substrate between a first source terminal and a first drain terminal, the nanosheet stack including at least one pair of horizontally oriented semiconductor nanosheets, wherein the nanosheet stack defines a first channel region between the first source terminal and the first drain terminal; a first work function metal surrounding the nanosheet stack and filling at least one vertical gap between the at least one pair of horizontally oriented semiconductor nanosheets; a set of fins positioned over the substrate between a second source terminal and a second drain terminal, wherein the set of fins is vertically oriented and horizontally separated from the nanosheet stack; and a second work function metal surrounding each fin in the set of fins, wherein a spacing between adjacent fins in the set of fins is greater than a spacing between adjacent horizontally oriented semiconductor nanosheets in the nanosheet stack.

Implementations may include one of the following features, or any combination thereof.

In certain aspects, the first work function metal includes an nFET work function metal, and the second work function metal includes a pFET work function metal.

In particular cases, the method can further include, after forming the first work function metal and prior to selectively removing the first work function metal: forming an organic planarization layer (OPL) to cover the first work function metal over the nanosheet stack, leaving a portion of the first work function metal surrounding the at least one fin exposed. In some aspects, selectively removing the first work function metal comprises removing a portion of the first work function metal underlying the OPL without removing the first work function metal surrounding the nanosheet stack. In certain embodiments, selectively removing the first work function metal includes undercut etching the portion of the first work function metal underlying the OPL. In particular aspects, the method further includes removing the OPL to expose the remaining portion of the first work function metal on the nanosheet stack.

In certain cases, the method further includes forming the precursor structure by: forming a precursor nanosheet stack on the substrate, the precursor nanosheet stack including the at least one pair of semiconductor nanosheets and the sacrificial nanosheet therebetween; forming an opening within a portion of the precursor nanosheet stack above the substrate to define the nanosheet stack of the precursor structure; forming the at least one fin within the opening and horizontally adjacent to the nanosheet stack; forming a shallow trench isolation (STI) between the at least one fin and the nanosheet stack within a trench in the substrate; and forming a dummy gate over the nanosheet stack and the at least one fin. In some aspects, forming the precursor structure further includes, after forming the dummy gate: replacing a lowermost layer of the nanosheet stack with a first isolation layer; and replacing a lowermost portion of the at least one fin with a second isolation layer. In certain cases, forming the at least one fin within the opening includes: forming a sacrificial layer within the opening; epitaxially growing a p-type layer over the sacrificial layer; forming a silicon nitride (SiN) layer over the p-type layer; and etching the SiN layer, the p-type layer and the sacrificial layer to define the at least one fin within the opening. In some embodiments, forming the at least one fin includes forming two fins, and forming the second work function metal surrounding the at least one fin defines a vertical gate-all-around (vGAA) PFET structure. In particular aspects, forming the second work function metal over the remaining portion of the first work function metal on the nanosheet stack defines a horizontal gate-all-around (hGAA) NFET structure horizontally adjacent to the PFET structure. In certain cases, a spacing between channels in the NFET structure is narrower than a spacing between channels in the PFET structure.

According to some embodiments, a height of the at least one fin as measured from an upper surface of the substrate is greater than a height of the nanosheet stack as measured from an upper surface of the substrate.

In particular aspects of the transistor structure, the second work function metal overlies the first work function metal on an upper surface and a sidewall of the nanosheet stack. According to certain embodiments, the first work function metal defines a horizontally extending step from the nanosheet stack over the substrate, and the second work function metal further overlies the first work function metal at the horizontally extending step, defining a corresponding step in the second work function metal.

In some cases, the transistor structure further includes an additional work function metal positioned on the second work function metal. In certain aspects, the transistor structure further includes: a first isolation region positioned between the substrate and a lowermost nanosheet of the nanosheet stack; and a second isolation region positioned between the substrate and each fin in the set of fins.

In certain aspects, the transistor structure further includes a shallow trench isolation (STI) positioned within the substrate horizontally between the nanosheet stack and the set of fins.

Two or more features described in this disclosure, including those described in this summary section, may be combined to form embodiments not specifically described herein.

BRIEF DESCRIPTION OF THE DRAWINGS

The embodiments of this disclosure will be described in detail, with reference to the following figures, wherein like designations denote like elements, and wherein.

Figure 1:
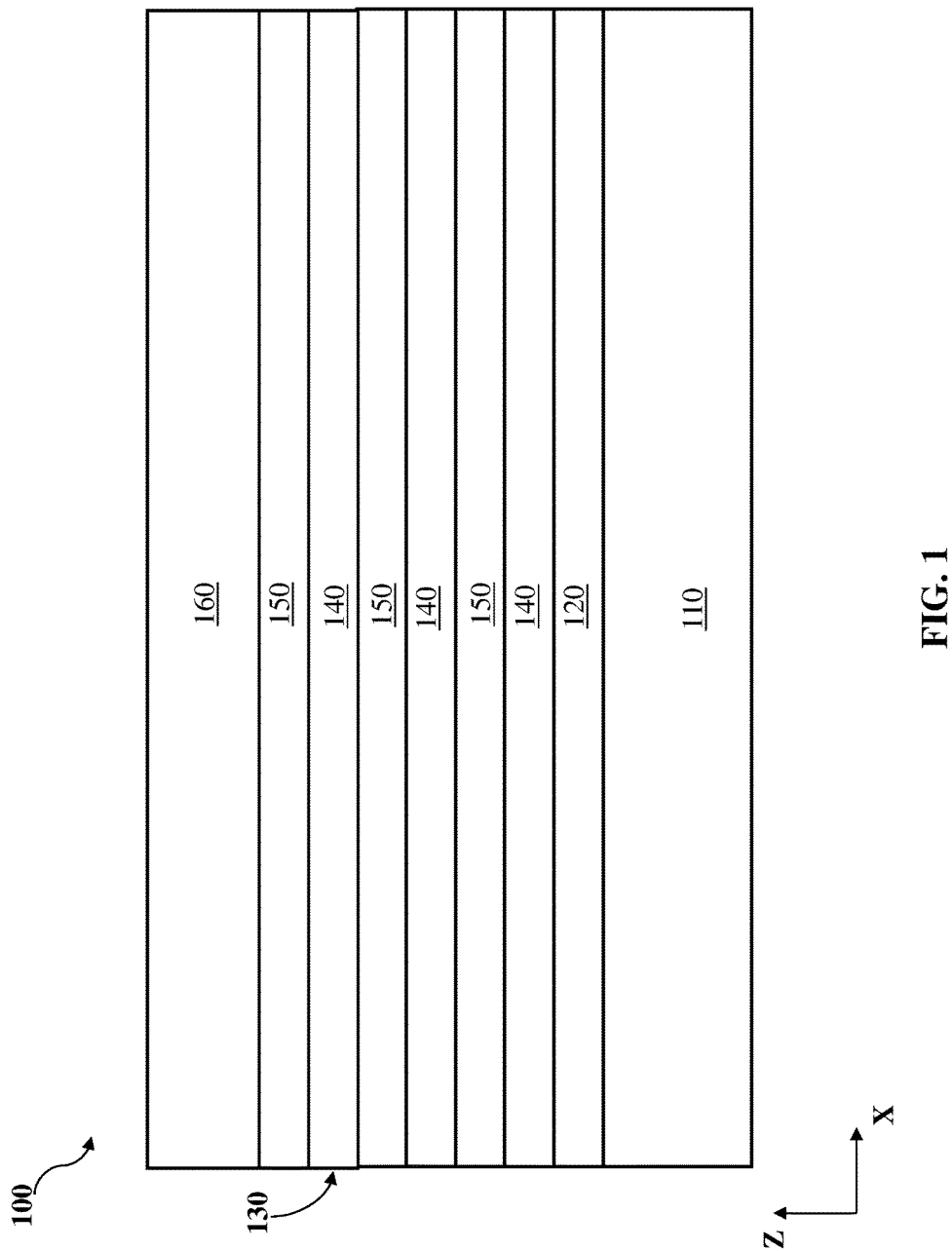
FIG. 1 shows a cross-sectional view, in plane X-Z, of a preliminary structure before being processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to integrated circuit (IC) design, and more particularly to gate-all-around (GAA) transistors with a vertical GAA (vGAA) structure adjacent a horizontal GAA (hGAA) structure. Embodiments of the disclosure include methods for forming a transistor structure to selectively delineate neighboring pFET and nFET devices. Particular methods include forming a vGAA structure adjacent to an hGAA structure and utilizing selective patterning to reliably separate these adjacent structures.

Commonly labeled components in the FIGURES are considered to be substantially equivalent components for the purposes of illustration, and redundant discussion of those components is omitted for clarity.

It will also be understood that when an element such as a layer, region, or substrate is referred to as being "on" or "over" another element, it may be directly on the other element or intervening elements may also be present. In contrast, when an element is referred to as being "directly on" or "directly over" another element, there are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Methods as described herein may be used in the fabrication of IC chips. The resulting integrated circuit chips may be integrated with other chips, discrete circuit elements, and/or other signal processing devices as part of either (a) an intermediate product, such as a motherboard, or (b) an end product. The end product can be any product that includes integrated circuit chips.

FIG. 1 illustrates a preliminary structure 100 in the formation of a field effect transistor (FET) structure, such as a GAA FET, according to various embodiments. As described further herein, the preliminary structure 100 can be used to form a precursor structure, which is described as undergoing various processes according to embodiments. While preliminary structure 100 can undergo processes described herein to form the precursor structure, it is understood that the precursor structure can be formed from other preliminary structures and/or according to distinct processes. Preliminary structure 100 and processes used to form the precursor structure are merely used for illustrative purposes.

As shown in FIG. 1, preliminary structure 100 includes a plurality of layers, which can be formed sequentially over one another, e.g., via conventional deposition, growth (e.g., epitaxial growth) or other known methods of forming a stack of layers. As shown, the preliminary structure 100 can include a substrate 110 including any currently-known or later developed material capable of being processed into a transistor structure, and may include, e.g., a bulk semiconductor layer, a semiconductor-on-insulator (SOI) substrate, etc., which may include one or more sites targeted for transistor formation as described herein. Substrate 110 thus may overlie one or more other layers of material having distinct material and/or electrical properties, with such layers of material being omitted from the accompanying FIGS. to better illustrate structures and processes to form an IC structure according to embodiments of the disclosure. Substrate 110 may include any currently known or later developed semiconductor material, which may include without limitation, silicon, germanium, silicon carbide, and those consisting essentially of one or more III-V compound semiconductors having a composition defined by the formula $AlX1GaX2InX3AsY1PY2NY3SbY4$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $ZnA1CdA2SeB1TeB2$, where A1, A2, B1, and B2 are relative proportions each greater than or equal to zero and $A1+A2+B1+B2=1$ (1 being a total mole quantity). Furthermore, the entirety of substrate 110 or a portion thereof may be strained.

Substrate 110 may have a variety of configurations, such as a bulk silicon configuration. Substrate 110 may also have a silicon-on-insulator (SOI) configuration that includes a bulk silicon layer, a buried insulation layer and an active layer, wherein semiconductor devices are formed in and above the active layer. As noted previously, substrate 110 may be made of silicon or it may be made of materials other than silicon. Thus, the terms "substrate" or "semiconductor substrate" should be understood to cover all semiconducting materials and all forms of such materials. Substrate 110 of preliminary structure 100 may be formed by forming a semiconductor material on an underlying structure (not shown). For the purposes of example and simplicity, other materials and/or layers positioned beneath substrate 110 have been omitted from the accompanying figures. Substrate 110 may be processed to include trenches, insulating materials, etc., for electrically isolating distinct transistor structures formed from the same substrate 110.

Various materials are referred to herein as being removed or otherwise "etched" according to embodiments. Etching generally refers to the removal of material (e.g., various structures formed above substrate 110, or portions of substrate 110, such as in the formation of a shallow trench isolation (STI)), and is often performed with a mask in place so that material may selectively be removed from certain areas of the substrate, while leaving the material unaffected in other areas of the substrate. One example of an etching process may include "dry etching." A dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotopic. Ion milling, or sputter etching, bombards the wafer with energetic ions of noble gases that approach the wafer approximately from one direction, and therefore this process is highly anisotopic.

Etchants selective to the composition of sacrificial material (e.g., majority-germanium semiconductor materials or other semiconductor materials discussed herein) may be particularly effective for removing sacrificial materials (e.g., sacrificial nanosheets) while leaving other materials intact. Various forms of selective etching may include, e.g., wet etching. Wet etching is generally performed with a solvent (such as an acid or a base) which may be chosen for its ability to selectively dissolve a given material (such as oxide), while, leaving another material (such as polysilicon or nitride) relatively intact. This ability to selectively etch given materials is fundamental to many semiconductor fabrication processes. A wet etch will generally etch a homogeneous material (e.g., nitride) isotopically, but a wet etch may also etch single-crystal materials (e.g. silicon wafers) anisotopically. Additional selective etching processes can include reactive ion etching (RIE), as discussed further herein.

Additionally, insulating or liner materials may be formed surrounding or otherwise insulating (e.g., lining) conductive elements in the structures disclosed herein. Where a liner may be appropriate for use in lining a conductive element, liners can include any currently known or later developed insulating material, e.g., an oxide, nitride, and/or other insulating material. Materials appropriate for the composition of a liner may include, for example, silicon dioxide ($SiO2$), silicon nitride (SiN), (SiCO), hafnium oxide ($HfO2$), alumina ($Al_2O_3$), yttrium oxide ($Y_2O_3$), tantalum oxide ($Ta2O5$), titanium dioxide ($TiO2$), praseodymium oxide ($Pr2O3$), zirconium oxide ($ZrO2$), erbium oxide (ErOx), other silicon and nitride-based materials (e.g., SiBCN, SiNC, SiNOC), organosilicon compounds, and other currently known or later-developed materials having similar properties.

Even further, masks or "masking materials" are described according to various processes herein. In some cases, masks can include an insulator material as noted above. In particular examples, a mask may include an insulator composed of a nitride or oxide material positioned beneath one or more layers of masking material, e.g., a silicon nitride or silicon oxide hard mask. The patterning of a hard mask may be accomplished by any currently known or later developed process of transferring a pattern from a mask or reticle to a photoresist layer deposited on a structure. Lithography processes may include, e.g., self-aligned double patterning (SADP), self-aligned quadruple patterning (SAQP), extreme ultraviolet (EUV) patterning, and/or other single or multiple patterning techniques. The patterning may be followed by ashing to separate the single layer of hard mask into a plurality of smaller structures, such that materials not covered by the mask may be etched.

According to an example, substrate 110 may be formed by deposition and/or wafer bonding, e.g., separation by implantation of oxygen (SIMOX). As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

In addition to deposition, various materials herein are referred to as being grown or epitaxially grown. Epitaxy" or "epitaxial growth," as used herein, refers to a process by which a thin layer of single-crystal or large-grain polycrystalline material is formed on an existing material with similar crystalline properties. One feature of epitaxy is that this process causes the crystallographic structure of the existing substrate or seed layer (including any defects therein) to be reproduced in the epitaxially grown material. Epitaxial growth can include heteroepitaxy (i.e., growing a material with a different composition from its underlying layer) or homoepitaxy (i.e., growing a material which includes the same composition as its underlying layer). In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Returning to FIG. 1, over substrate 110 is a precursor insulator layer 120, which can include any epitaxy semiconductor materials described herein, e.g., silicon germanium (SiGe) (or more particularly, SiGe60). Precursor insulator layer 120, as described herein, can be used to later form an isolation region in the transistor structure. Over precursor insulator layer 120 is a precursor nanosheet stack 130, which can include a set of alternating sacrificial nanosheets 140 and nanosheets 150 stacked over one another, such that each nanosheet 150 is separated from a neighboring nanosheet 150 by a sacrificial nanosheet 140. In some cases, the sacrificial nanosheets 140 can include a sacrificial material described herein, e.g., SiGe (such as a SiGe 30 layer), and nanosheets 150 can include silicon (Si). Overlying an uppermost nanosheet 150 is a hard mask 160, which can include any mask material described herein, and in some cases, includes a silicon nitride (SiN) layer.

Various sacrificial materials initially positioned on substrate 110 may determine the shape of structures formed in later manufacturing steps. One or more layers of sacrificial material (e.g., sacrificial nanosheets 140) may be positioned on substrate 110, and formed by way of deposition, epitaxial growth, and/or any other currently known or later developed procedure of forming a semiconductor material on another semiconductor material. For targeted removal or modification of sacrificial materials with respect to substrate 110 and other semiconductor materials, sacrificial materials may have a different material composition from substrate 110 and other materials (e.g., nanosheets 150). According to an example, sacrificial materials may include silicon germanium (SiGe) with a predetermined concentration of silicon and germanium therein. As discussed elsewhere herein, sacrificial materials may exhibit a higher germanium concentration relative to other sacrificial materials formed thereon. It is therefore understood that sacrificial materials may generally include a majority-germanium region of SiGe. It is possible in alternative implementations for sacrificial materials to include a majority-silicon region of SiGe, or other semiconductor material. According to one example, sacrificial materials may have a germanium concentration of between approximately forty and approximately eighty percent. According to another example, sacrificial materials may have a germanium concentration of approximately sixty percent.

Precursor structure 100 may include additional sacrificial materials, e.g., positioned over one another. Additional sacrificial materials may also have a different material composition from that of substrate 110 and/or other sacrificial material. The material composition of one sacrificial material being different from another sacrificial material may allow those sacrificial materials to be processed (e.g., targeted for etching) independently from one another. According to an example, one sacrificial material may include SiGe with a germanium concentration less than that of another sacrificial material. The composition of one sacrificial material may be selected based on the germanium concentration of another sacrificial material, and may exhibit a majority-silicon or majority-germanium composition.

Semiconductor nanosheets 150 and sacrificial nanosheets 140 may initially be formed as alternating layers of material above substrate 110. Semiconductor nanosheets 150 may be formed from any currently known or later developed semiconductor material, e.g., silicon, with the various example compositions of substrate 110 being operable for use in semiconductor nanosheets 150. Sacrificial nanosheets 140, by contrast, can be composed of a different material relative to the composition of semiconductor nanosheets 150, e.g., one or more materials selected to facilitate replacement with different materials (e.g., conductive and/or insulator materials) in subsequent processing. According to an example embodiment, as noted herein, sacrificial nanosheets 140 may include silicon germanium (SiGe). In this case, sacrificial nanosheets 140 may be replaced with one or more conductive materials in subsequent processing according to any currently known or later developed technique for providing a conductive nanosheet between semiconductor nanosheets 150. For example, sacrificial nanosheets 140 may be removed by longitudinally etching and removing the components of each sacrificial nanosheets 140 and filling/replacing the semiconductor material with a conductive metal.

In any case, each nanosheet 150 and sacrificial nanosheets 140 may be structurally distinct from other elements described herein by having a significantly reduced thickness as compared to other transistor elements. In an example, each individual nanosheet 150 may have a vertical thickness of, e.g., approximately five nm, or between approximately three nm and approximately ten nm. Each sacrificial nanosheets 140 may have a vertical thickness of, e.g., 11 nm, or between 6 nm to 15 nm.

Figure 2:
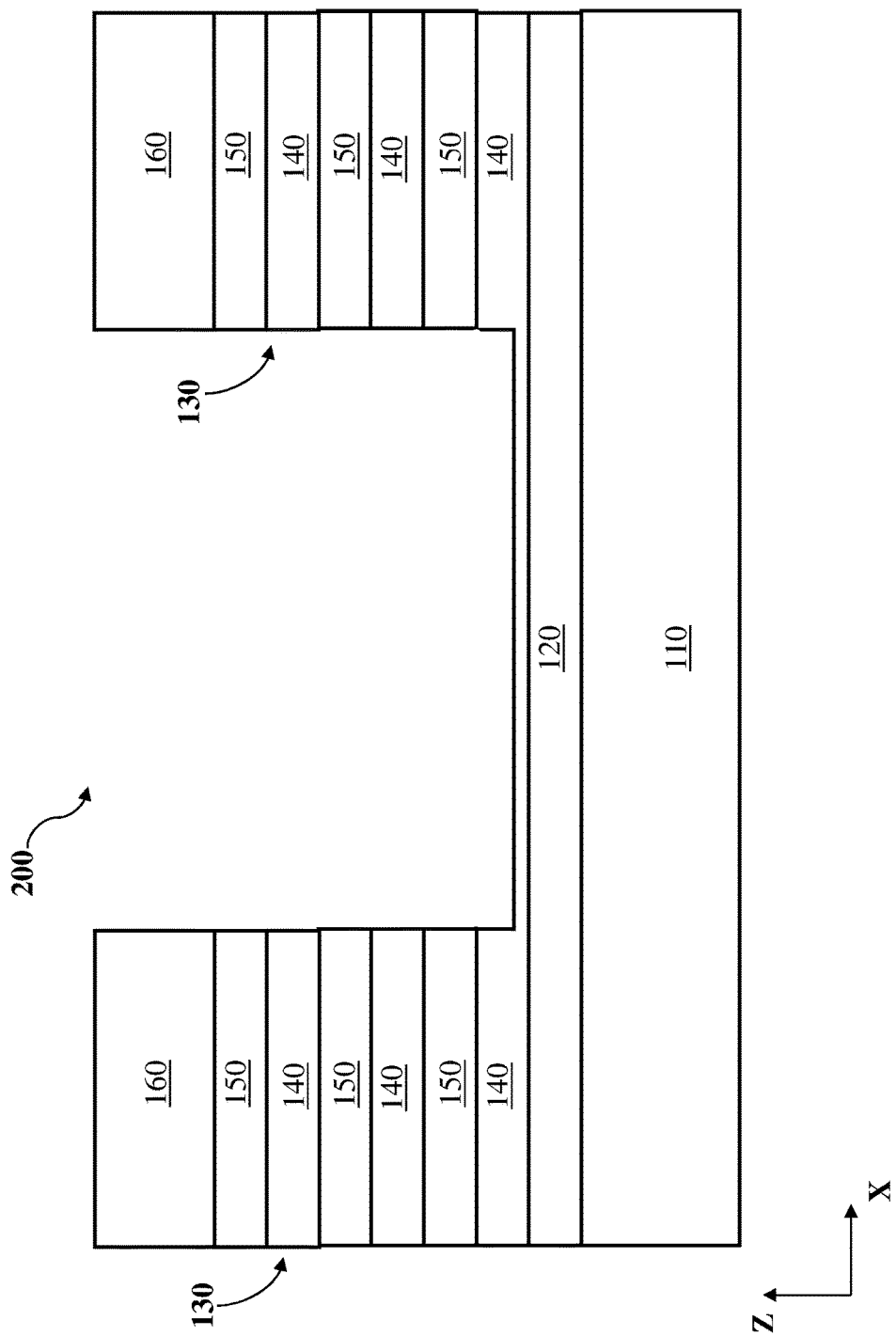
FIG. 2 illustrates a process in forming a precursor structure from the preliminary structure, according to embodiments of the disclosure.

FIG. 2 illustrates a first process of forming an opening 200 in the preliminary structure 100 of FIG. 1, which may include conventional masking and etching processes to expose a lowermost sacrificial nanosheet 140 in the precursor nanosheet stack 130. In some cases, a portion of the lowermost sacrificial nanosheet 140 remains after the opening 200 is formed.

Figure 3:
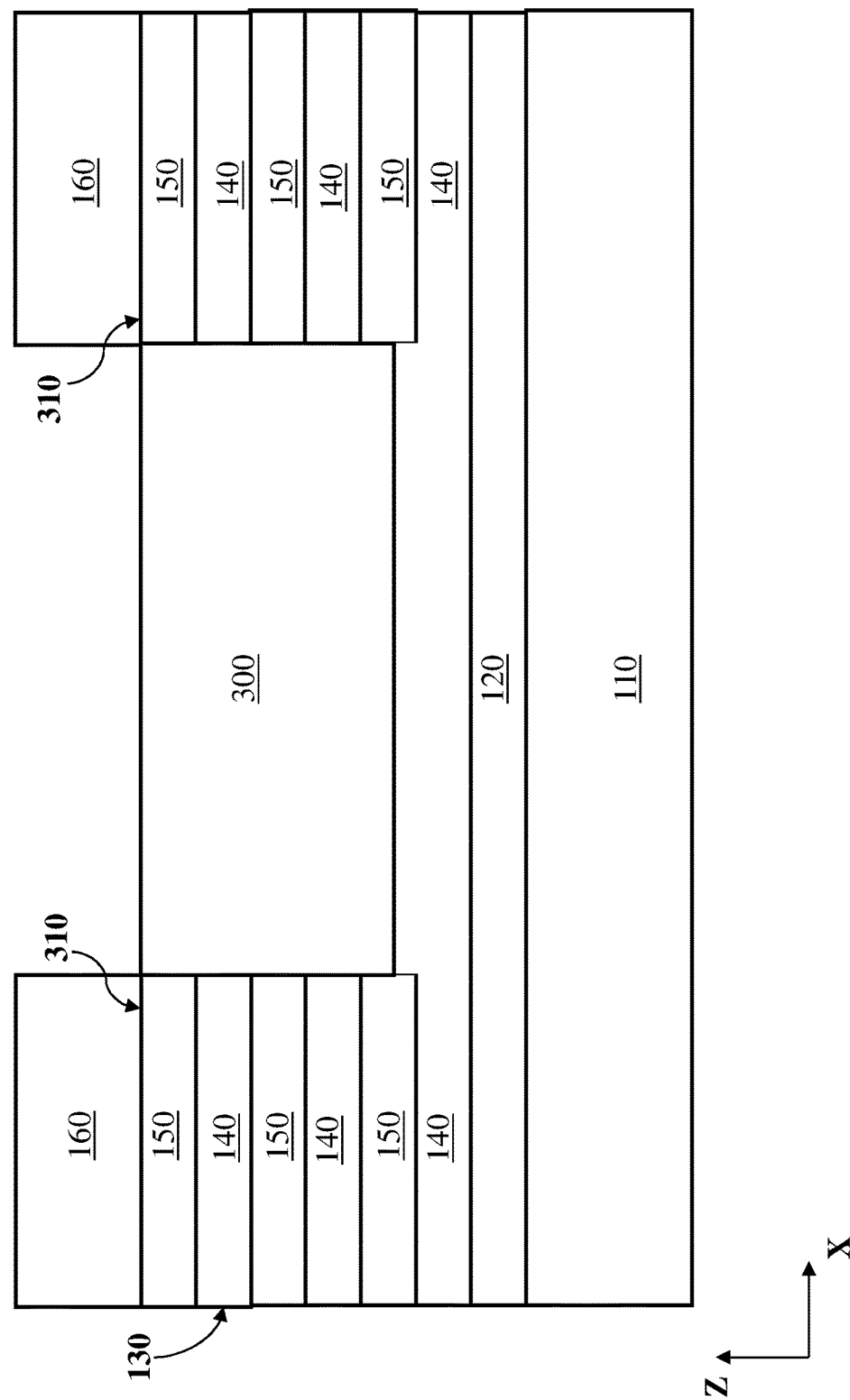
FIG. 3 illustrates an additional process in forming a precursor structure from the preliminary structure, according to embodiments of the disclosure.

FIG. 3 illustrates an additional process of substantially filling opening 200 with a precursor fin layer 300, which can include silicon or other semiconductor materials described herein (and in most cases, distinct from the material composition of precursor insulator layer 120 and sacrificial nanosheet 140). The precursor fin layer 300 can be epitaxially grown in the opening 200 over the lowermost sacrificial nanosheet 140, and may be grown to a height approximately equal with an upper surface 310 of the uppermost nanosheet 150. In various embodiments, as shown in FIG. 3, prior to growing precursor fin layer 300, additional sacrificial nanosheet 140 can be formed (e.g., grown) over the lowermost sacrificial nanosheet 140.

Figure 4:
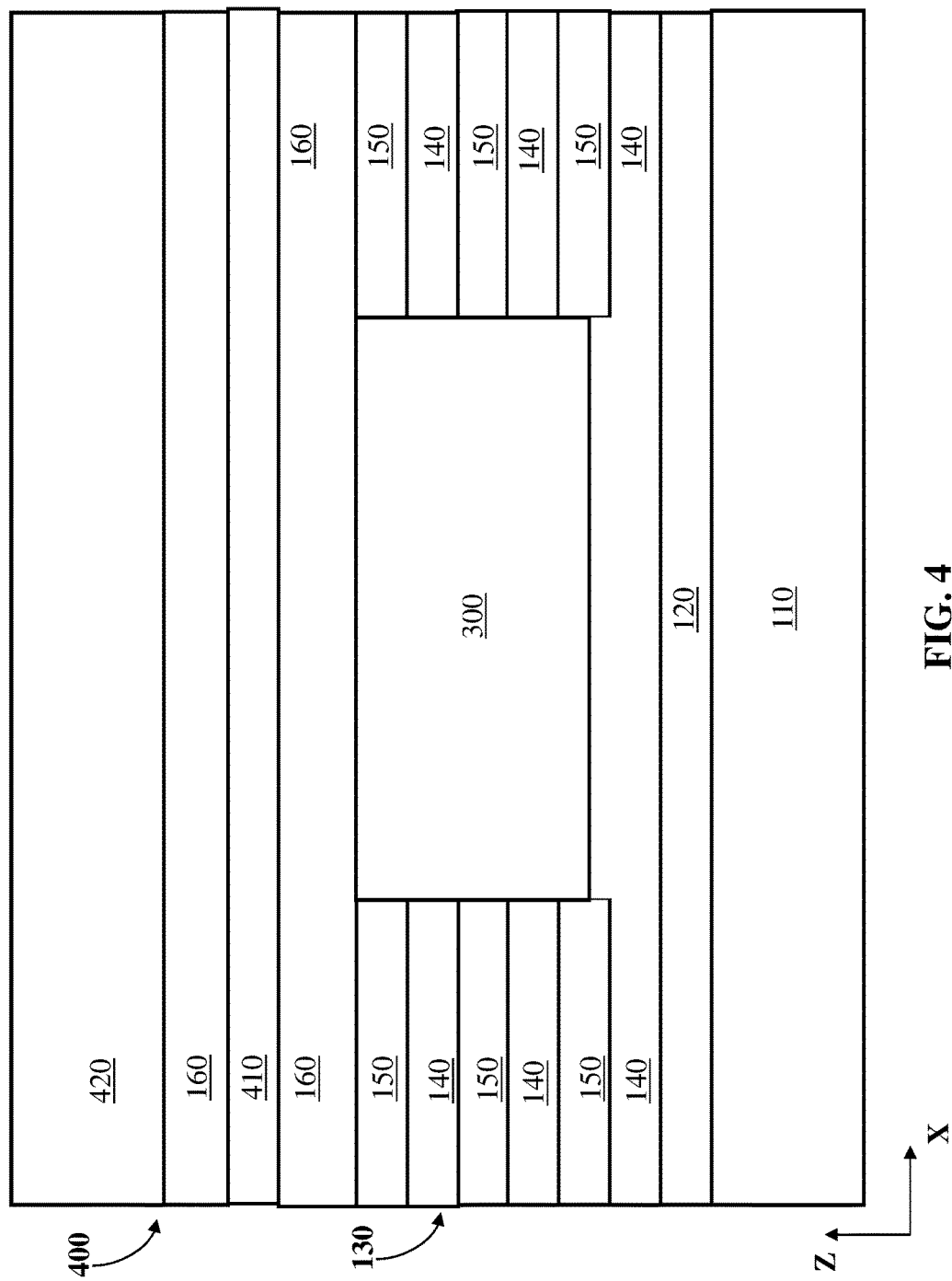
FIG. 4 illustrates a further process in forming a precursor structure from the preliminary structure, according to embodiments of the disclosure.

Following formation of precursor fin layer 300, as shown in FIG. 4, a patterning stack 400 is formed over the structure of FIG. 3. In some cases, the hard mask 160 shown in FIG. 3 over uppermost nanosheet 150 is removed prior to forming a refresh hard mask 160 over that uppermost nanosheet 150, followed by the patterning stack 400. In this example process, an amorphous carbon (a-C) layer 410 is formed over the mask 160, and an additional mask layer 160 is formed over the a-C layer 410. Additionally, a mask 420 (e.g., a hard mask as described herein, such as a silicon hard mask having amorphous Si) can be formed over the uppermost mask layer 160. All layers shown in FIG. 4 can be formed according to conventional techniques described herein (e.g., deposition or other approaches described herein).

Figure 5:
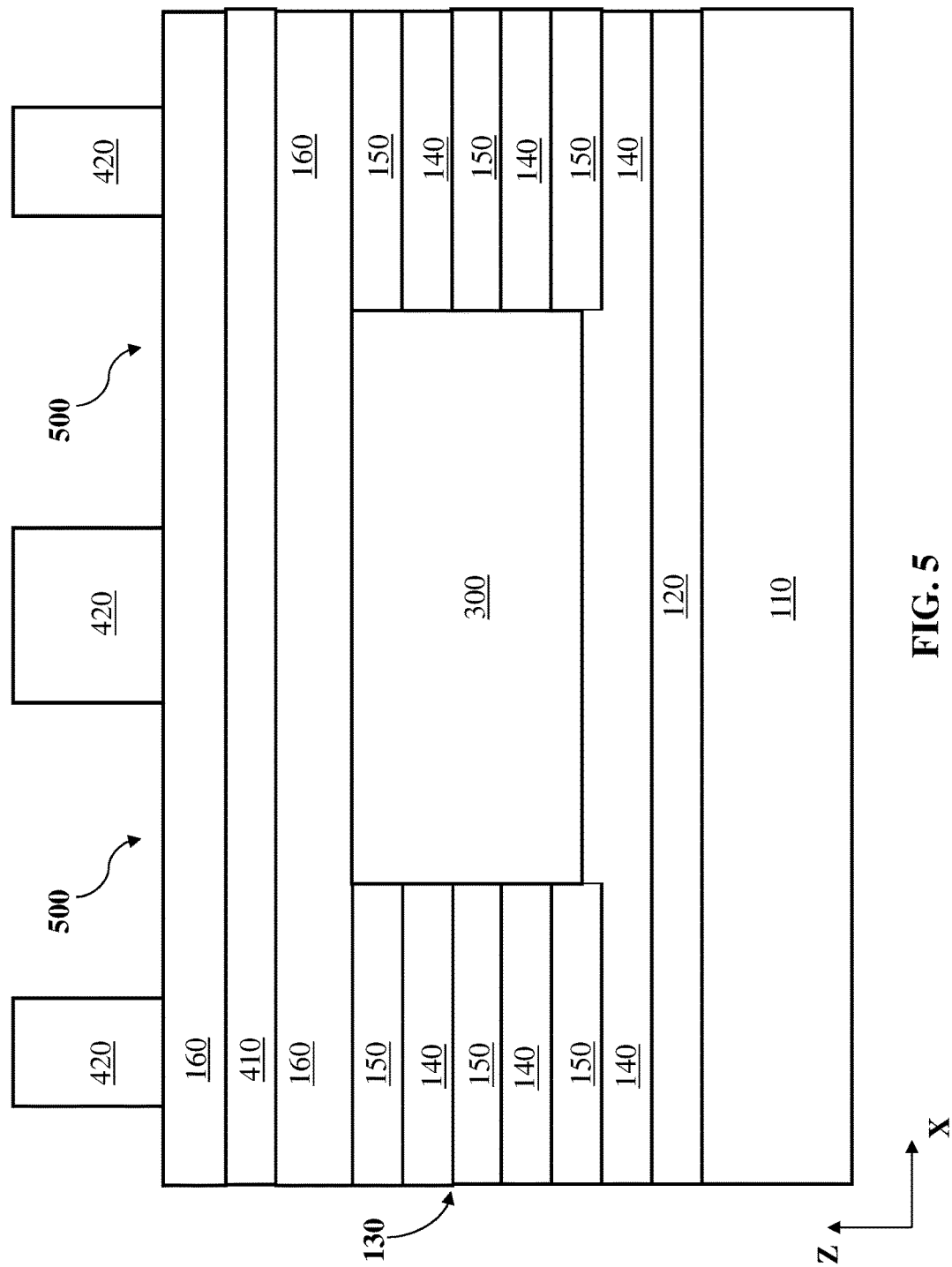
FIG. 5 illustrates another process in forming a precursor structure from the preliminary structure, according to embodiments of the disclosure.

FIG. 5 illustrates a process of removing portions of the mask 420 (e.g., via extreme ultra-violet (EUV) patterning) to expose portions 500 of the underlying mask 160 in the uppermost layer.

Figure 6:
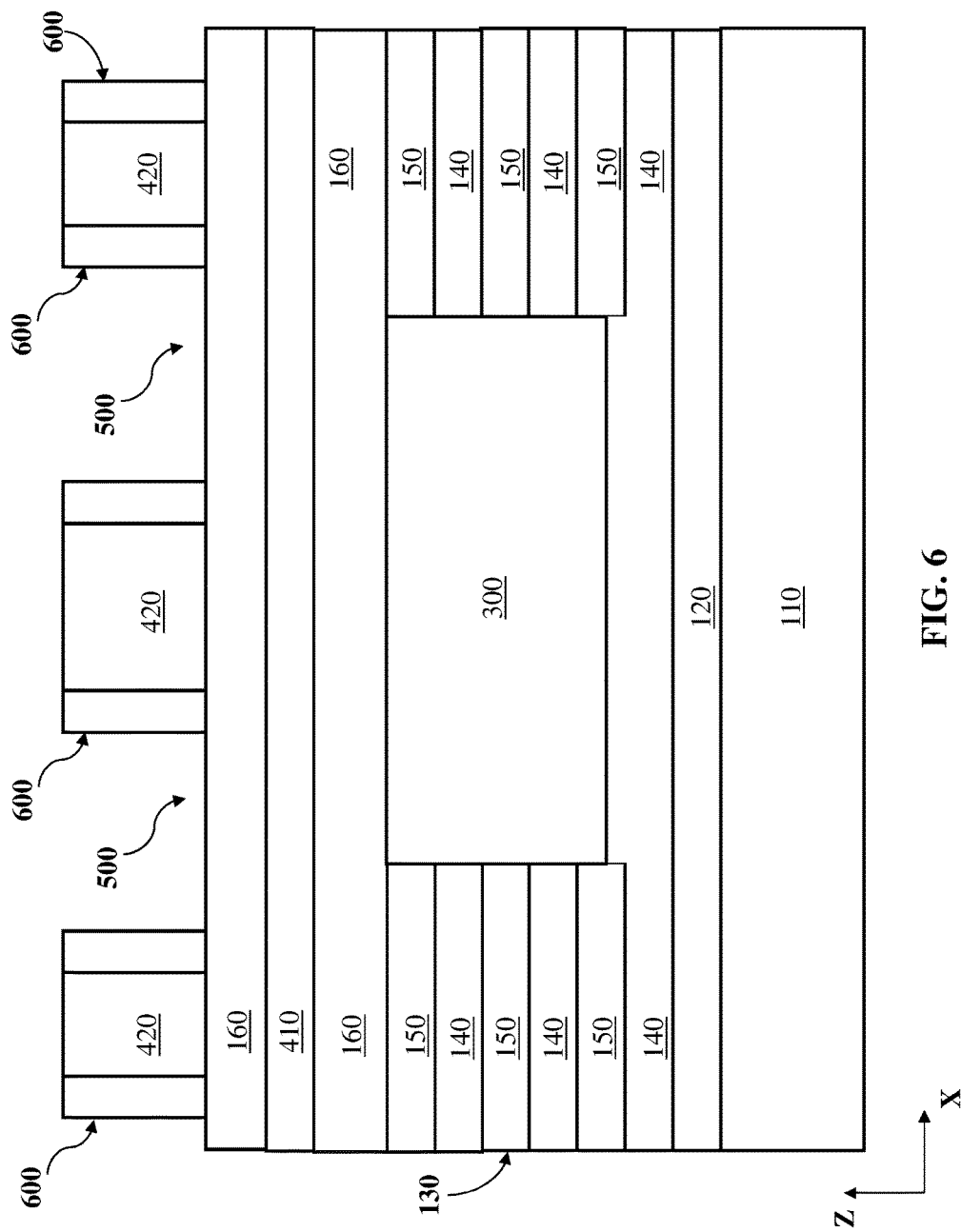
FIG. 6 illustrates an additional process in forming a precursor structure from the preliminary structure, according to embodiments of the disclosure.

FIG. 6 shows formation of oxide spacers 600 around the mask 420, e.g., by processes described herein. Materials appropriate for use as spacer material 600 may include, e.g., SiO2, silicon nitride, SiBCN, SiNC, SiN, SiCO, and SiNOC, etc., and it is understood that different portions of spacer material 600 may have the same material composition or a different material composition. Spacer 600 may initially be formed by ALD deposition, followed by anisotropic etching of spacer material between mask 420.

Figure 7:
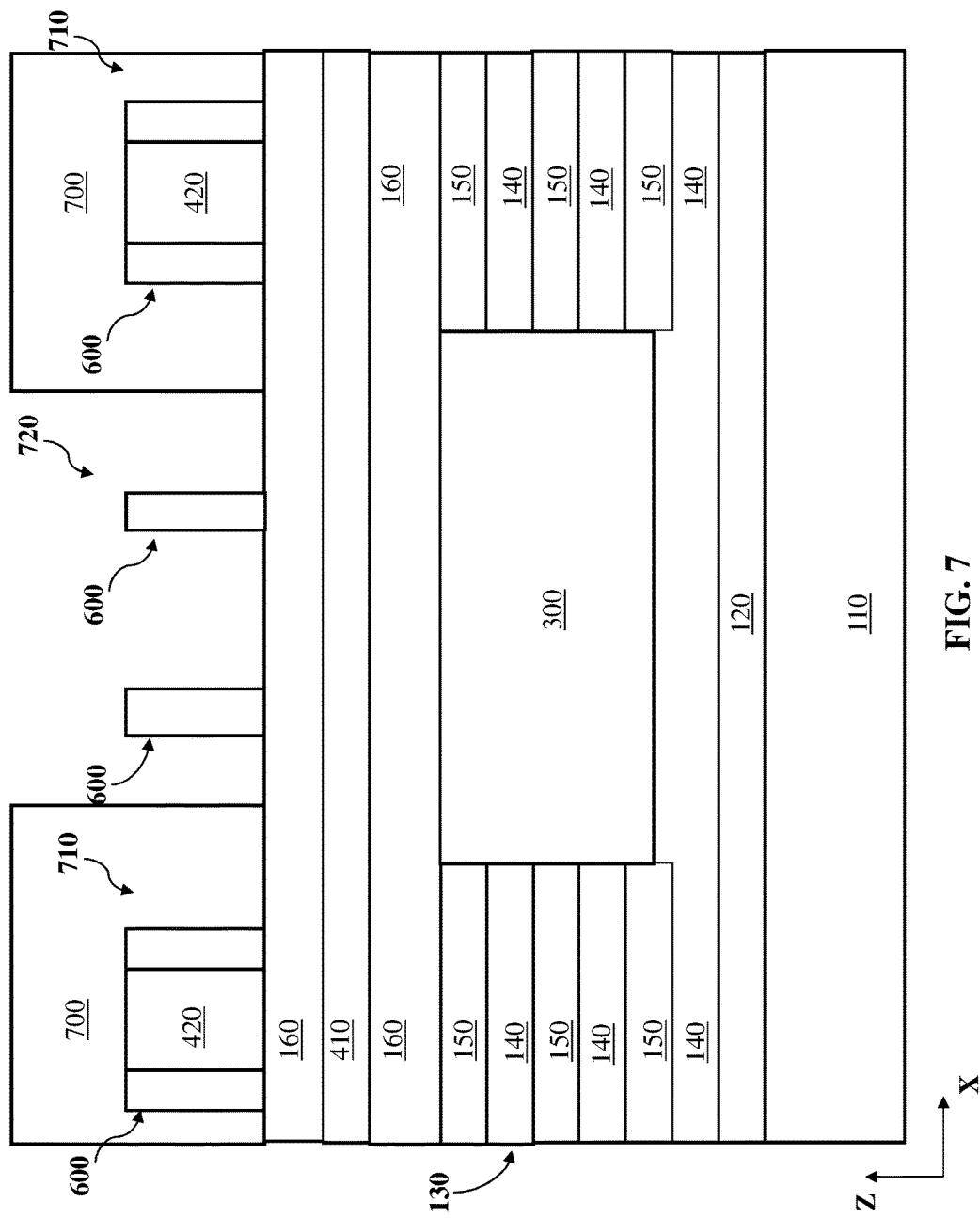
FIG. 7 illustrates a further process in forming a precursor structure from the preliminary structure, according to embodiments of the disclosure.

FIG. 7 shows a lithography patterning step which masks (or, protects, with an OPL layer 700) a region 710 used to subsequently form a horizontal gate-all-around (hGAA) device, and exposes a region 720 used to subsequently form a vertical GAA (vGAA) device. During this patterning process, mask 420 is selectively removed from between spacers 600 in region 720.

Figure 8:
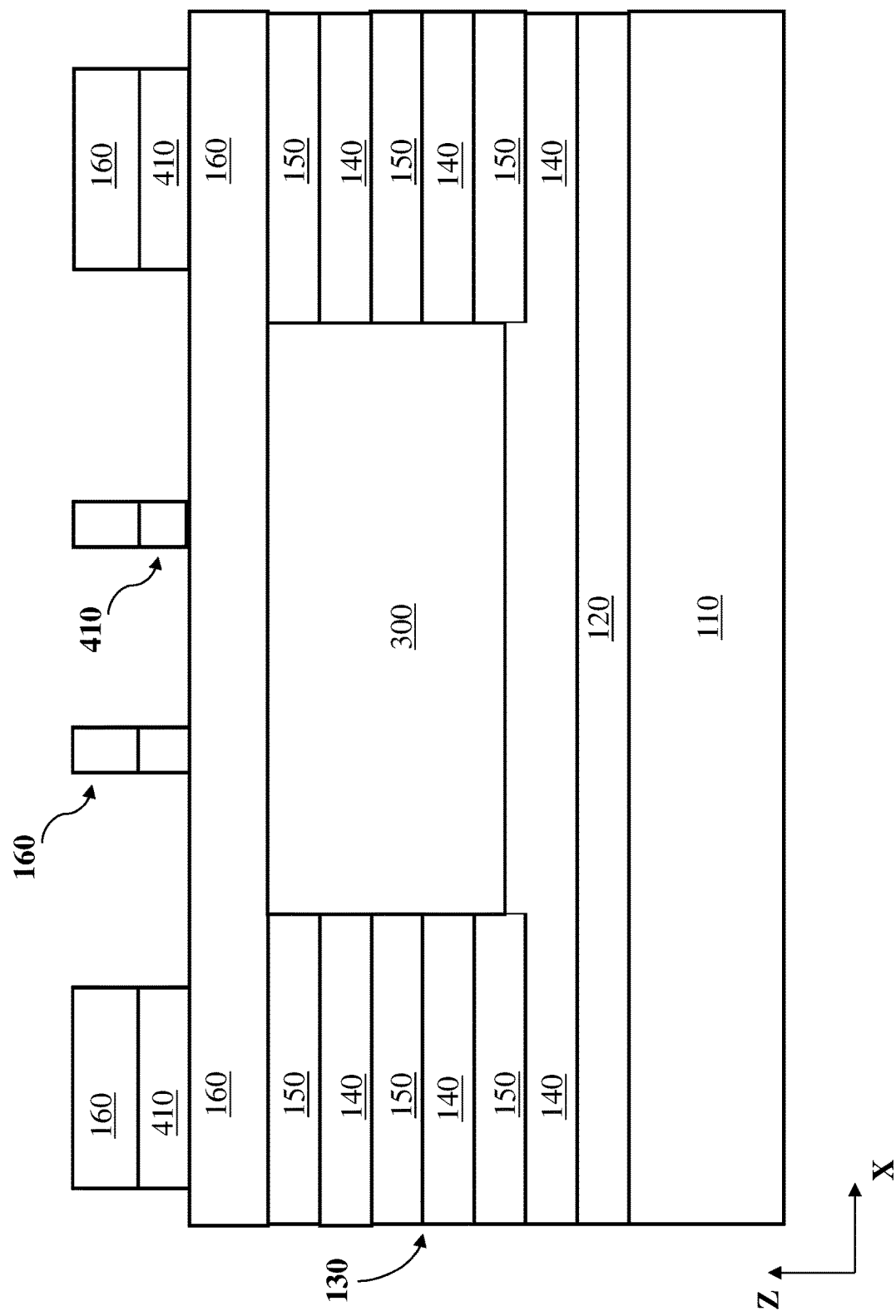
FIG. 8 illustrates another process in forming a precursor structure from the preliminary structure, according to embodiments of the disclosure.

FIG. 8 illustrates removal of the OPL 700 and etching to transfer the pattern of the remaining spacers 600 and mask 420 (FIG. 7) to the underlying uppermost mask layer 160 and a-C layer 410. This can be performed using etching processes described herein.

Figure 9:
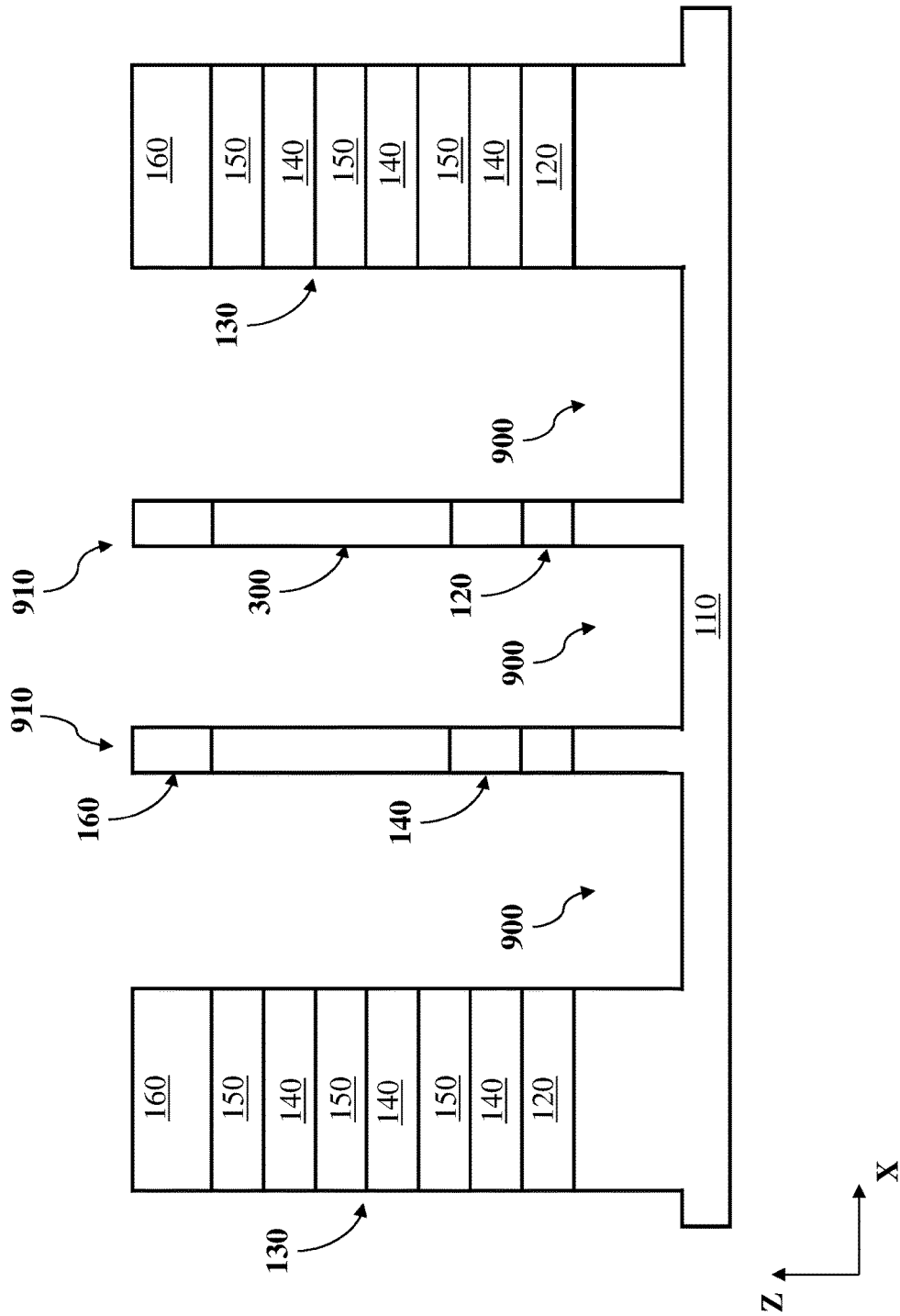
FIG. 9 illustrates an additional process in forming a precursor structure from the preliminary structure, according to embodiments of the disclosure.

FIG. 9 illustrates transferring the pattern from the uppermost mask layer (e.g., SiN layer) layer 160 and a-C layer 420 to the lowermost mask layer (e.g., SiN layer) 160, the precursor nanosheet stack 130 and portions of the precursor fin layer 300. This patterning process also forms shallow trench openings 900 in substrate 110 and precursor fins 910 over the substrate 110. Patterning transfer can be performed using a conventional plasma dry etch process.

Figure 10:
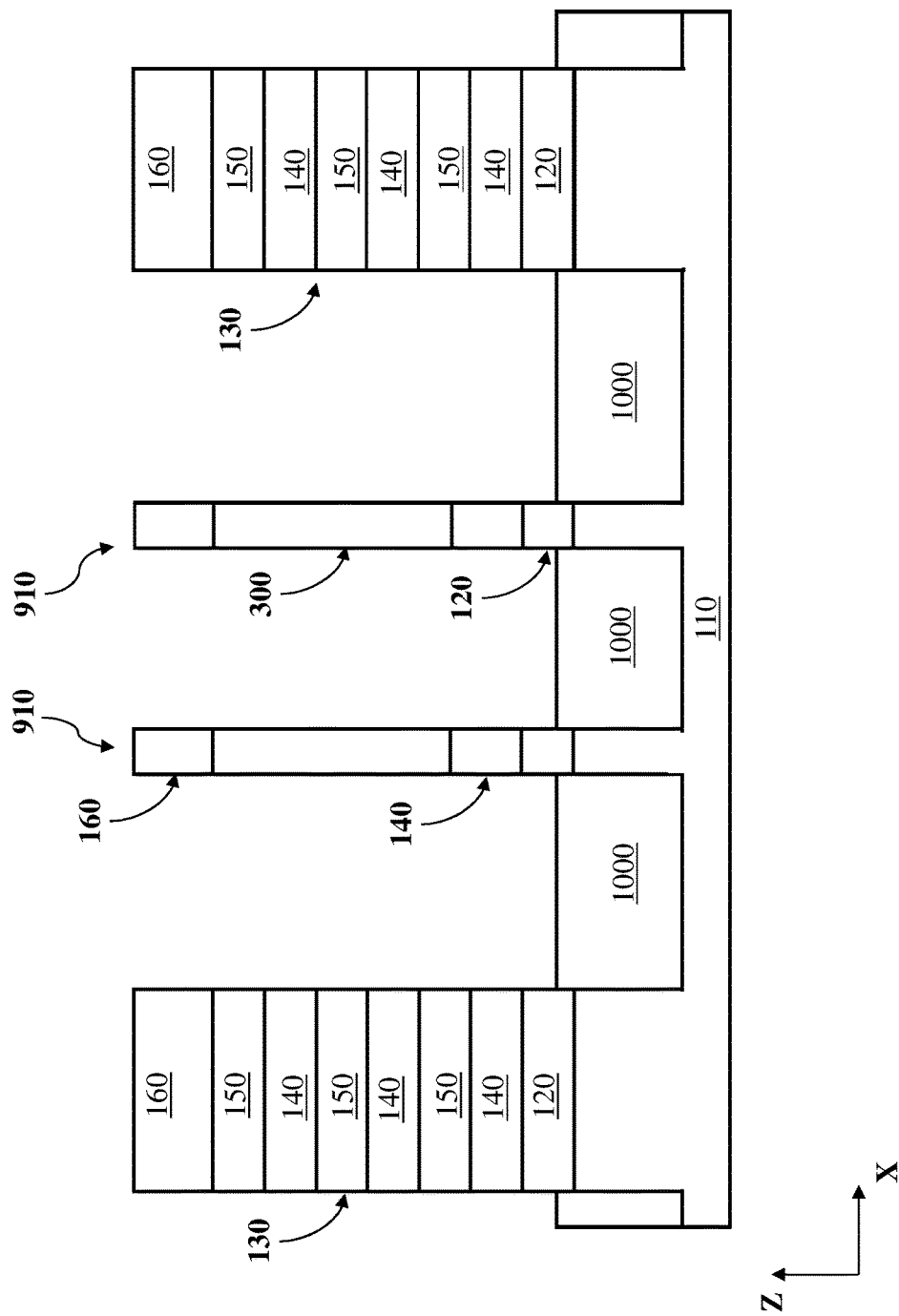
FIG. 10 illustrates a further process in forming a precursor structure from the preliminary structure, according to embodiments of the disclosure.

FIG. 10 illustrates formation of shallow trench isolations (STIs) 1000 in the shallow trench openings 900 in substrate 110 (FIG. 9). STIs 1000 can be formed by depositing a semiconductor material in shallow trench openings 900 to form isolation regions. STIs 1000 separate neighboring precursor nanosheet stacks 130 and precursor fins 910. STI(s) 1000 may be formed to provide structural and electrical separation between semiconductor channel material(s) and device components formed thereon. STI 1000 may be formed of any currently-known or later developed substance for providing electrical insulation, and as examples may include: silicon nitride (Si3N4), silicon oxide (SiO2), fluorinated SiO2 (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. STI 100 may be formed to a height above the height of substrate 110 and reveal at least some portion of precursor insulator layer 120. STI 1000 may be formed by CVD or ALD dielectric deposition followed by chemical mechanical planarization (CMP) and recessing.

Figure 11:
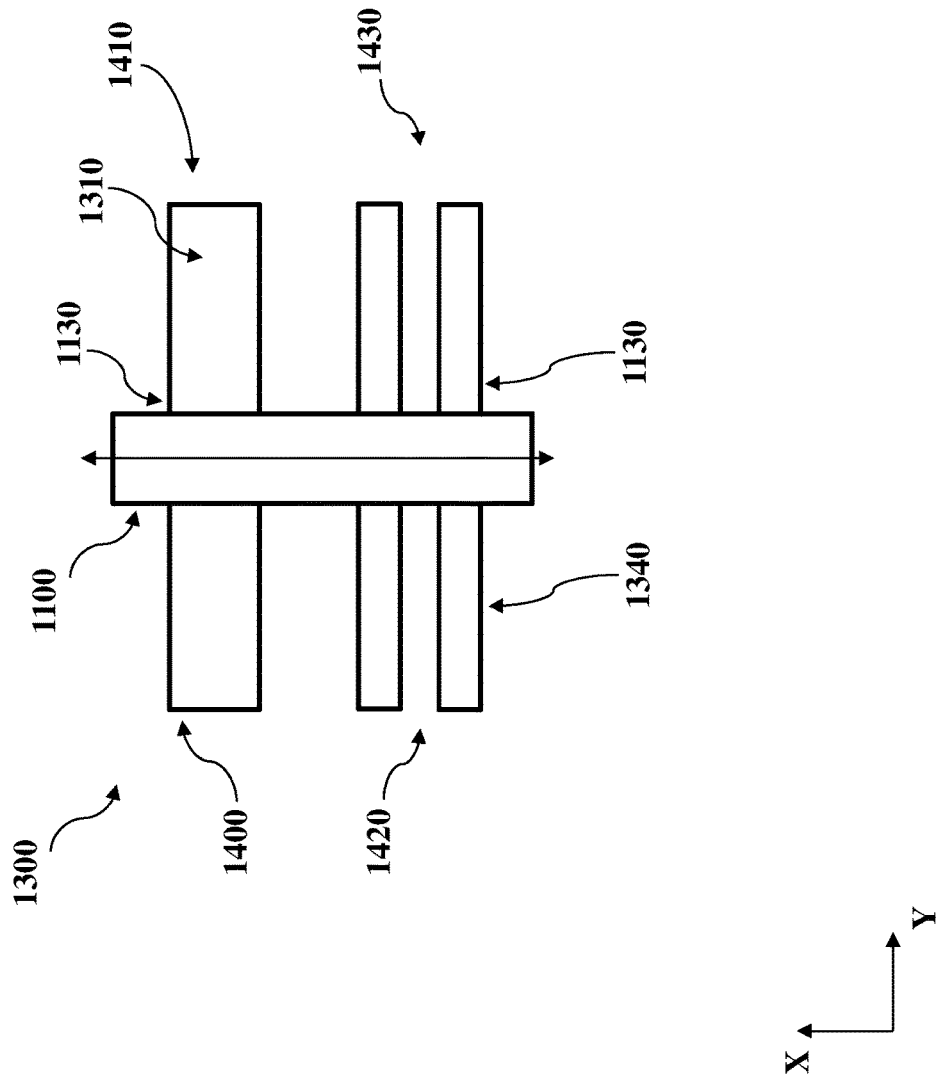
FIG. 11 illustrates a portion of the precursor structure of FIG. 10, additionally including a gate hard mask, in plane X-Y.
Figure 12:
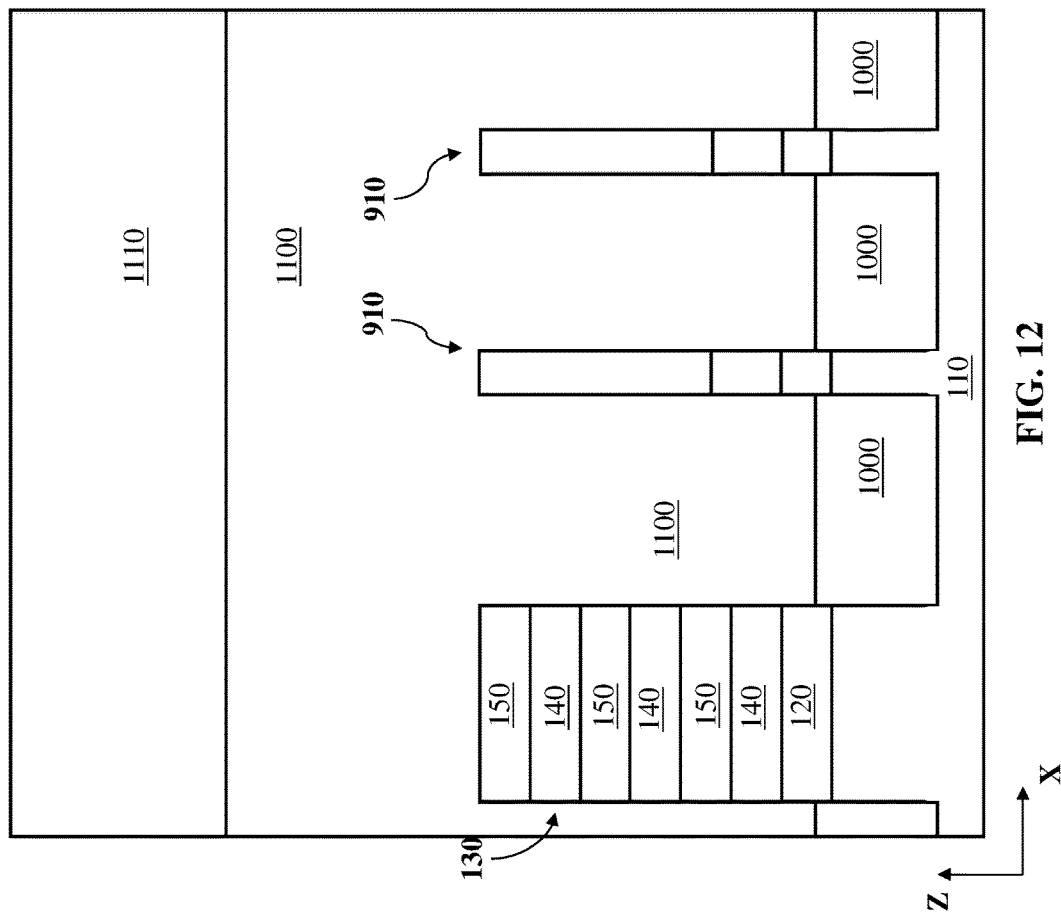
FIG. 12 illustrates another process in forming a precursor structure from the preliminary structure, according to embodiments of the disclosure.

FIG. 11 shows a portion of the precursor structure of FIG. 10, further including a dummy gate 1100 formed over the precursor nanosheet stacks 130 and precursor fins 910 (FIG. 10). FIG. 12 illustrates the cross-sectional view of the process illustrated in FIG. 11, including forming the dummy gate 1100 over the STIs 1000 and surrounding the remaining precursor nanosheet stack 130 and precursor fins 910. FIG. 12 also illustrates a process of forming a gate hardmask 1110 over dummy gate 1100. Dummy gate 1100 can be deposited or otherwise formed to surround the remaining precursor nanosheet stack 130 and precursor fins 910 over the STIs 1000, and gate hardmask 1110 can be deposited or otherwise formed over the dummy gate 1100. After dummy gate 1100 and gate hardmask 1110 deposition, lithography and etch processes are performed to form arrays of dummy gates 1100. This process will keep the dummy gate 1100 and gate hardmask 1110 over the channel region 1130 of the subsequently formed hGAA and vGAA devices, and remove the unwanted dummy gate materials from the source/drain regions (first source terminal 1400 and first drain terminal 1410, and second source terminal 1420 and second drain terminal 1430, in FIG. 11).

Figure 13:
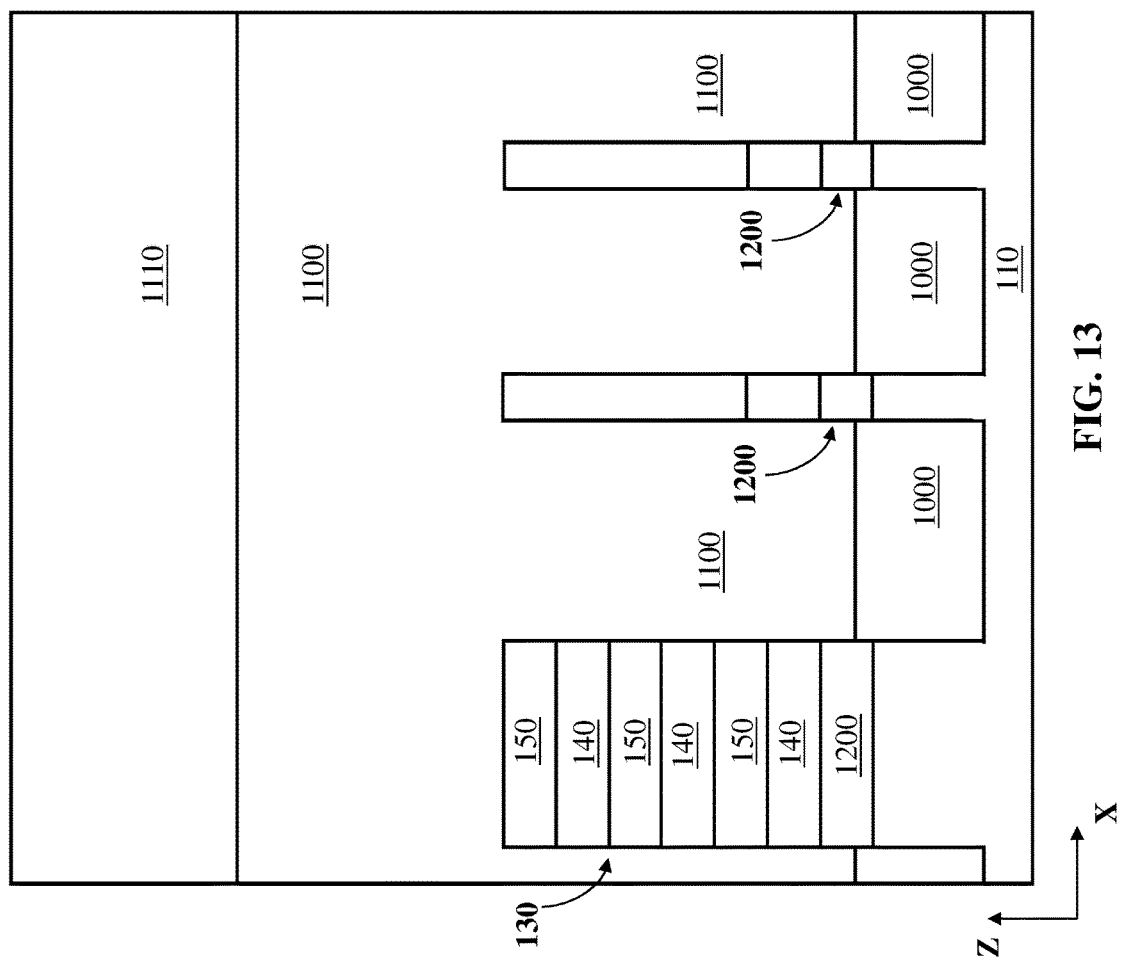
FIG. 13 illustrates an additional process in forming a precursor structure from the preliminary structure, according to embodiments of the disclosure.

FIG. 13 shows a process of forming an isolation region 1200 from precursor insulator layer 120 (FIG. 12) along the portions of precursor nanosheet stacks 130 and precursor fins 910 not covered by the dummy gate 1110. As described with respect to FIG. 10, after portions of the dummy gate 1110 are removed from the source/drain regions (source terminals 1400, 1420 and drain terminals 1410, 1430), the sacrificial layer 120 at source/drain region is exposed, and an isotropic selective etch process can be used to selectively remove SiGe60 to other surrounding materials, like SiGe30, oxide, and a-Si. This process can form a cavity under the portions of precursor nanosheet stacks 130 and precursor fins 910 not covered by the dummy gate 1110. After forming this cavity, a gate spacer is deposited by ALD, which will fill in these cavities under the portions of precursor nanosheet stacks 130 and precursor fins 910 not covered by the dummy gate 1110, and form the isolation region 1200 as shown in FIG. 13. In various embodiments, the isolation region 1200 is formed of SiN, SiOCN or SiBCN, SiOC or SiC.

Figure 14:
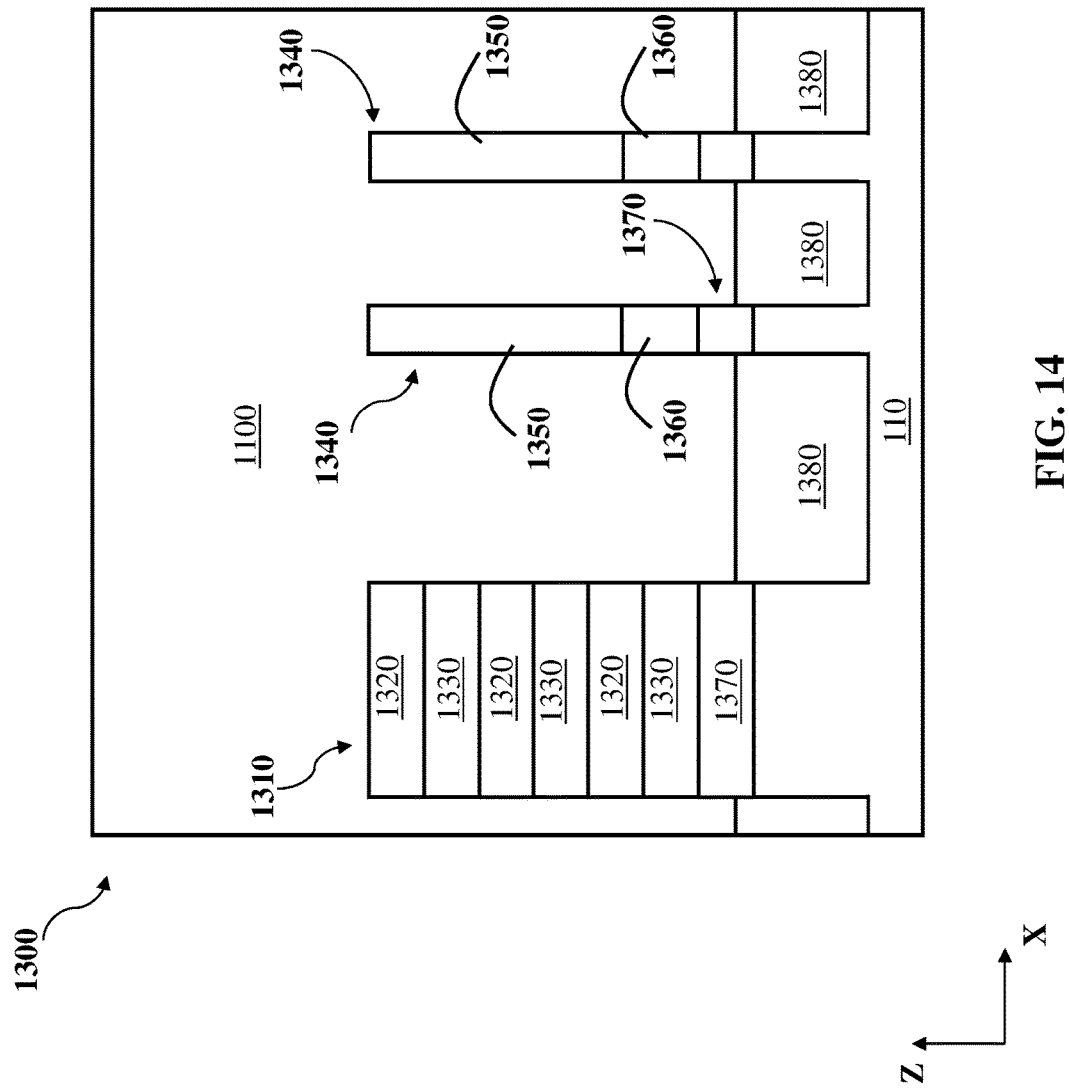
FIG. 14 illustrates a precursor structure, in plane X-Z, according to embodiments of the disclosure.

FIG. 14 shows additional processes in forming a precursor structure 1300, as described herein. In some cases, these additional processes can include source/drain region formation for the vGAA and hGAA devices, followed by ILD oxide deposition and CMP (not illustrated). After ILD CMP, gate HM 1110 is further removed to leave the precursor structure 1300. At this stage, dummy gate 1100 is exposed, and can be subsequently removed using a wet removal process, such as hot ammonia or TMAH chemical etch. As noted herein, precursor structure 1300 can be formed according to a variety of approaches, one example of which is described according to processes illustrated in FIGS. 1-13. It is understood that precursor structure 1300 can also be formed according to additional approaches not specifically described herein. In any case, the processes described in the following figures can be utilized to form a field effect transistor (FET) structure, such as a GAA FET, from precursor structure 1300.

Referring to FIG. 14, precursor structure 1300 can include a nanosheet stack 1310 positioned over substrate 110 between a first source terminal 1400 and a first drain terminal 1410 (not shown in this view, illustrated in FIG. 11). Precursor structure 1300 illustrates only a single nanosheet stack 1310, however, as noted with respect to FIGS. 1-13, a plurality of nanosheet stacks 1310 can be formed using approaches according to embodiments.

With continuing reference to FIG. 14, nanosheet stack 1310 can include at least one horizontally oriented semiconductor nanosheet 1320 (e.g., similar to nanosheet(s) 150 in FIGS. 1-13), which are vertically separated (in the z-direction) by a sacrificial nanosheet 1330 from bottom isolation 1370 (e.g., similar to sacrificial nanosheet(s) 140 in FIGS. 1-13). The term "horizontally oriented" indicates that the nanosheets 1320 have a larger dimension in a horizontal direction (e.g., x-direction or y-direction) than in a vertical direction (z-direction). Several sacrificial nanosheets 1330 are shown in this example, which separate neighboring nanosheets 1320.

Additionally, positioned over substrate 110 and between a second source terminal 1420 and a second drain terminal 1430 (not shown in this view, illustrated in the top view of FIG. 11), is at least one fin 1340 (two shown in this example). Each fin 1340 is vertically oriented and horizontally separated from the nanosheet stack 1310. As shown in FIG. 14, the fin 1340 can include a fin layer 1350 (including, e.g., silicon), along with a sacrificial fin layer 1360 (including, e.g., material similar to sacrificial nanosheets 140). In some embodiments, the width of fin 1340 is approximately 3 nanometers (nm) to approximately 15 nm, with a height of approximately 25 nm to approximately 120 nm. Additionally, as described herein, the horizontal separation between adjacent fins 1340 is greater than the vertical separation between adjacent nanosheets 1320 in the stack 1310.

With continuing reference to FIG. 14, separating the nanosheet stack 1310 and each fin 1340 from the substrate 110 is an isolation region 1370 (several shown), which can be formed in a similar manner as isolation 1200 shown in FIG. 13, including similar materials. Additionally, one or more shallow trench isolation (STI) regions 1380 (e.g., similar to STI 1000 in FIG. 10) can be formed in the substrate 110, according to processes described herein or other conventional processes.

Figure 15:
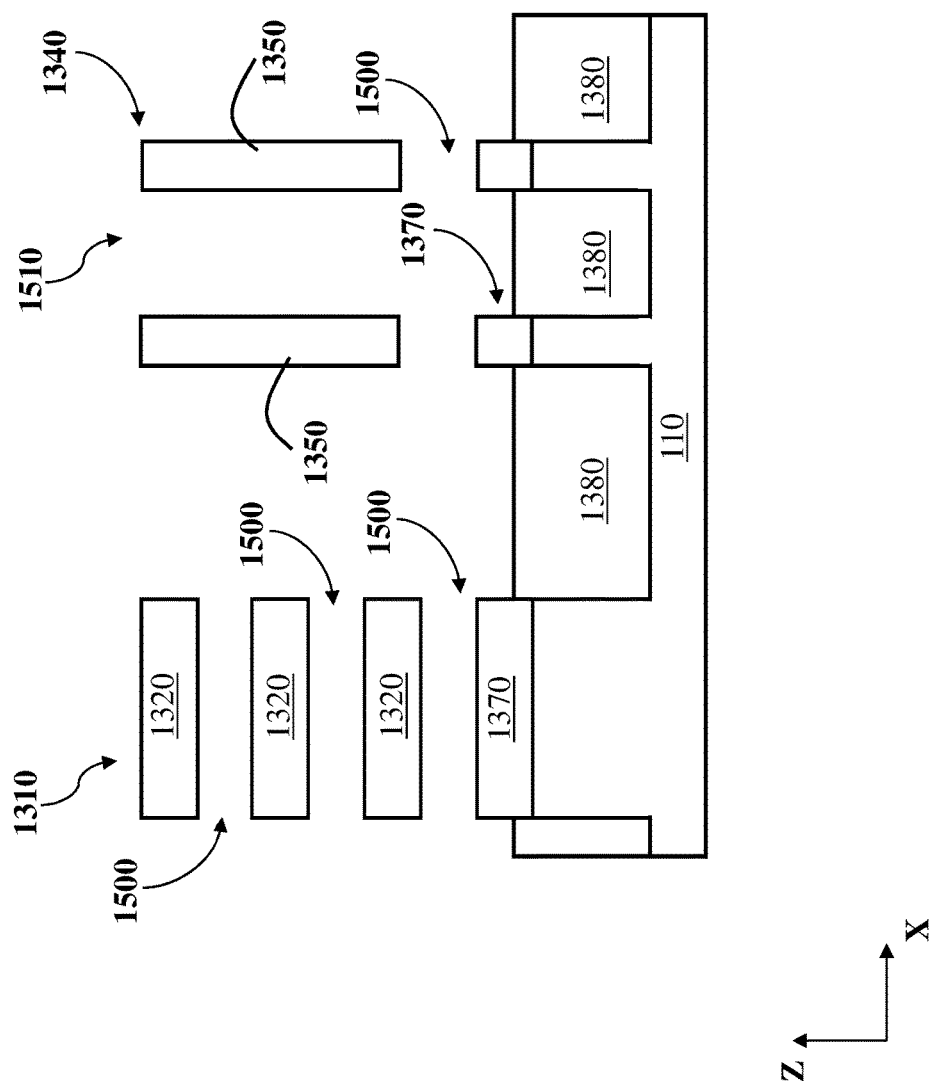
FIG. 15 illustrates a process, in plane X-Z, in forming a transistor structure from the precursor structure, according to embodiments of the disclosure.

FIG. 15 illustrates a first process in fabricating a GAA transistor structure from the precursor structure 1300. As shown, an initial process can include selectively removing the sacrificial nanosheet(s) 1330 (FIG. 14) to open a vertical gap 1500 between the semiconductor nanosheets 1320 (as well as between the isolation region 1370 in fin 1320 and the fin layer 1350). In some cases, a dry etch can be used to selectively remove sacrificial nanosheets 1330, e.g., a vapor phased HCl dry etch could selectively remove SiGe30 to Si and other surrounding materials.

Figure 16:
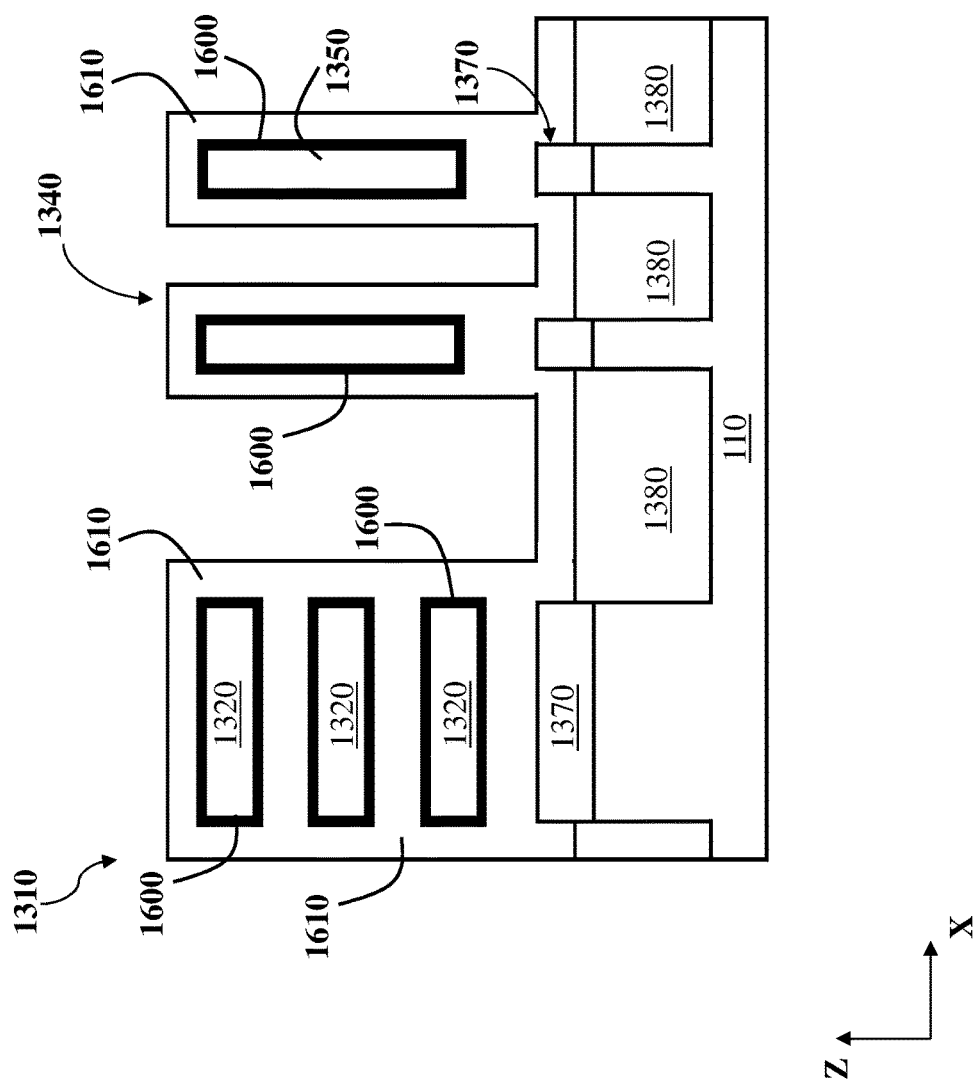
FIG. 16 illustrates an additional process in forming a transistor structure from the precursor structure, according to embodiments of the disclosure.

FIG. 16 illustrates an additional process including forming a high-k dielectric 1600, followed by forming a first work function metal 1610 (nFET metal) to surround the nanosheet stack 1310 and the fin(s) 1320. High-k dielectric 1600 can be deposited by conventional approaches, e.g., by ALD, and can include a dielectric such as HfO2. First work function metal 1610 can be deposited by ALD to fill the vertical gap 1500 (FIG. 15) between the semiconductor nanosheets 1320 and fill a horizontal gap 1510 (FIG. 15) between each fin 1320 and the isolation region 1370. In various embodiments, the first work function metal 1610 will pinch-off the vertical gap 1500 without completely filling the horizontal gap 1510. First work function metal 1610 can include an nFET work function material, and may include, e.g., any combination of conducting materials (e.g., metal, doped semiconductor materials, etc.) for providing an electrostatic gate dielectric layer. As further examples, first work function metal 1610 can be in the form of any currently known or later developed conductive material such as, e.g., aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof.

Figure 17:
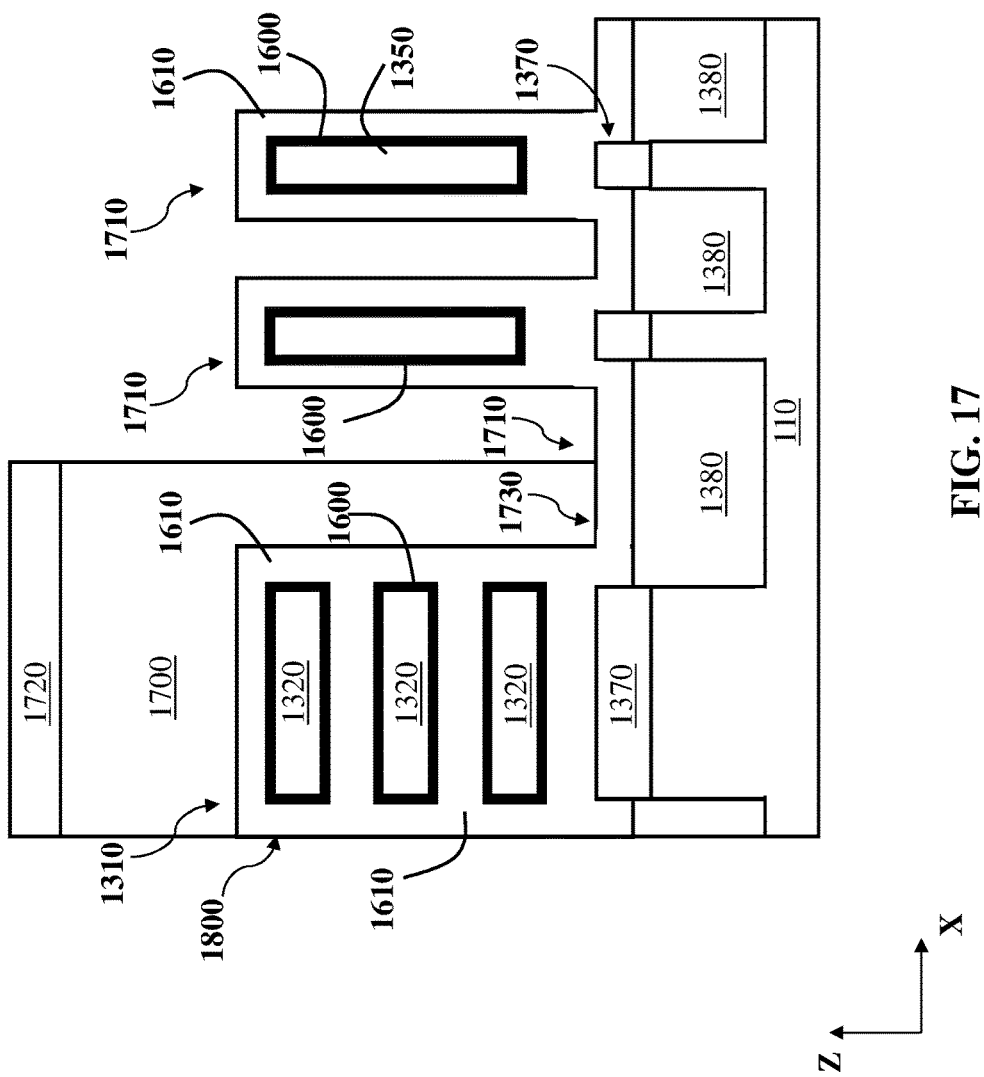
FIG. 17 illustrates another process in forming a transistor structure from the precursor structure, according to embodiments of the disclosure.
Figure 18:
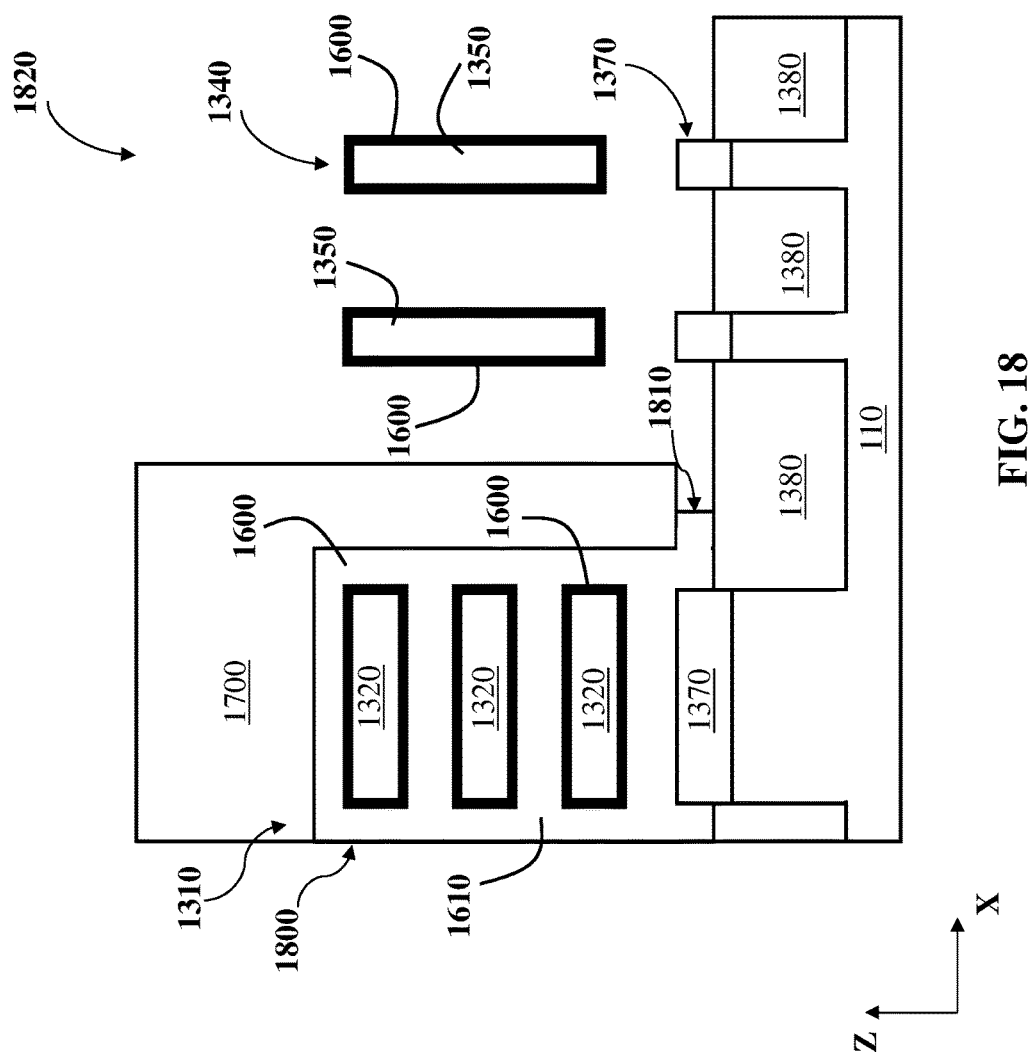
FIG. 18 illustrates a further process in forming a transistor structure from the precursor structure, according to embodiments of the disclosure.

FIGS. 17 and 18 illustrate additional processes including selectively removing first work function metal 1610 surrounding the fin(s) 1350 while preserving an entirety of first work function metal 1610 surrounding nanosheet stack 1310. FIG. 17 illustrates a first process of forming an organic planarization layer (OPL) 1700 to cover first work function metal 1610 over the nanosheet stack 1310, e.g., via deposition such as ALD. In various embodiments, a mask (e.g., a TiOx layer) 1720 can be formed over the OPL 1700, as a lithography patterning layer. Additionally, FIG. 18 illustrates performing a lithography process to expose a vGAA device region 1820, including performing a RIE process to etch away the OPL 1700 from vGAA device region 1820, such that first work function metal 1610 is exposed. In contrast to conventional approaches of forming directly neighboring vGAA devices, because the space between the vGAA device region 1820 and the nanosheet stack 1310 (precursor to hGAA device region, described herein) is not pinched-off by the first work function metal 1610, OPL 1700 can be completely removed using the RIE process. Additionally, as shown in FIG. 18, the patterning and etching performed on first work function metal 1610 can etch away the mask 1720.

FIG. 18 illustrates selectively removing first work function metal 1610 including removing a portion 1730 (FIG. 17) of first work function metal 1610 underlying OPL 1700 without removing the portion 1800 of first work function metal 1610 surrounding nanosheet stack 1310. In various embodiments, this process includes undercut etching the portion 1730 (FIG. 17) of first work function metal 1610 underlying OPL 1700. As noted herein, a work function metal such as first work function metal 1610 is conventionally removed by an isotropic etch process, e.g., SC1 wet removal. However, as embodiments of the disclosure do not pinch of space between the vGAA device region 1820 and nanosheet stack 1310 (or between fins 1350 in vGAA device region 1820) OPL 1700 can be completely removed using a directional dry etch process. The first work function metal 1610 is fully exposed when performing this SC1 wet removal, so a relatively isotropic process (with less process budget than conventional removal processes) is sufficient to remove the first work function metal 1610 from the exposed fins 1350. As such, the process of undercut etching the portion 1730 (FIG. 17) of first work function metal 1610 underlying OPL 1700 can be tightly controlled in order to prevent over-etching, which is a common shortcoming of conventional approaches. However, if both the nFET and pFET region (FIG. 20) are formed of an hGAA structure (such as a nanosheet stack), a large amount of undercut etching would be necessary to remove the first work function metal 1610, thereby undesirably over-etching the first work function metal 1610.

As illustrated in FIG. 18, in some example embodiments, selectively removing the first work function metal 1610 using the undercut etching process can define a horizontally extending step 1810 from the nanosheet stack 1310 over the substrate 110. The size and shape of horizontally extending step 1810 can vary, however, in any case, the approaches described herein can prevent unwanted etching of the first work function metal 1610 around the nanosheet stack 1310. As described herein, the conventional GAA fabrication processes can fail to selectively remove work function metal around nanosheet stacks, increasing the rate of failure of those devices. As shown in FIG. 18, forming nanosheet stack 1310 adjacent fin(s) 1320, in conjunction with other processes described herein, can facilitate selective etching around the nanosheet stack 1310.

Figure 19:
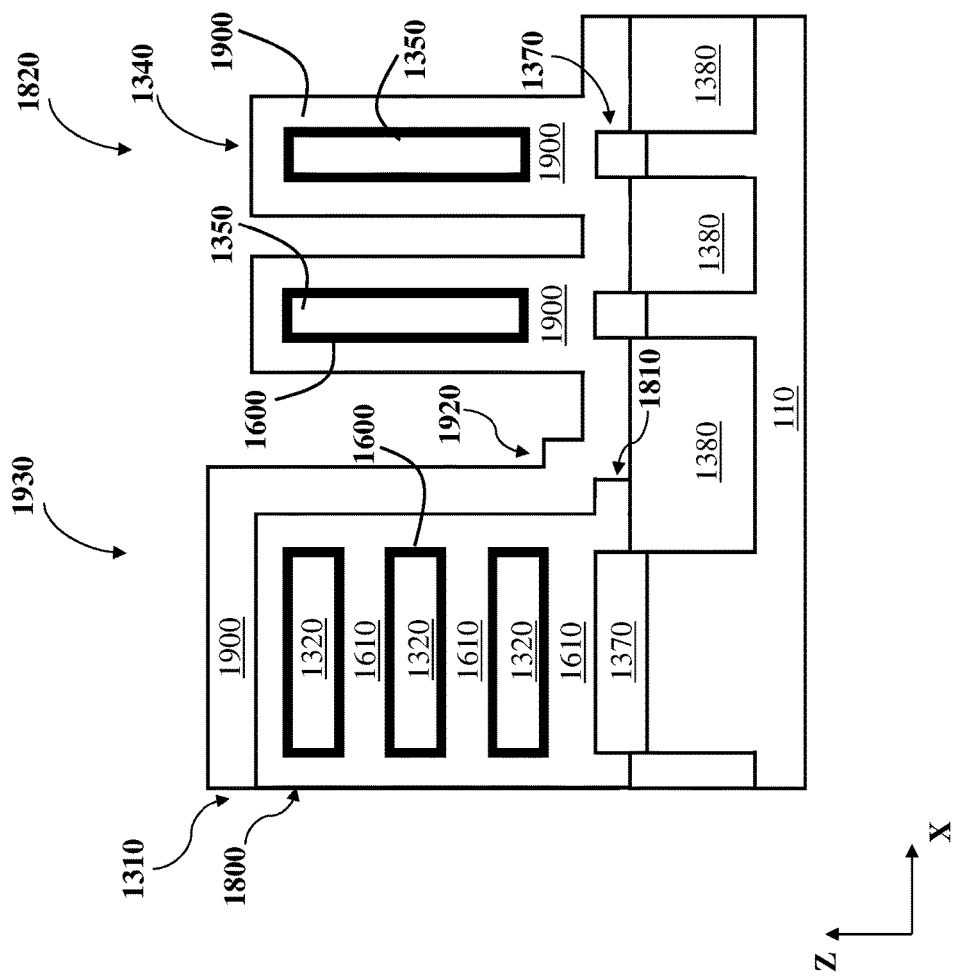
FIG. 19 illustrates an additional process in forming a transistor structure from the precursor structure, according to embodiments of the disclosure.

FIG. 19 shows several additional processes, including removing OPL 1700 (and mask 1720) to expose the remaining portion 1800 of first work function metal 1610 on nanosheet stack 1310. The OPL 1700 can be removed via any conventional processes such as washing. FIG. 19 also illustrates forming a second work function metal 1900 (pFET metal) over a remaining portion of the first work function metal 1610 on the nanosheet stack 1310 (including on an upper surface and sidewalls of the first work function metal 1610 on stack), and formation of second work function metal 1900 surrounding fin(s) 1350. Second work function metal 1900 can be deposited or otherwise formed over fin(s) 1350 and over the surfaces of remaining portions of first work function metal 1610. In various embodiments, first work function metal 1610 includes a different material than second work function metal 1900. In some particular cases, second work function metal 1900 includes a pFET work function material, and may include TiN, TaN, TiAl, TiC, TiAlC, or combinations, etc.

As shown in FIG. 19, in some cases, the second work function metal 1900 overlies first work function metal 1610 at horizontally extending step 1810 in first work function metal 1610, and defines a corresponding step 1920 in second work function metal 1900. The second work function metal 1900 is shown overlying the first work function metal 1610 in a horizontal GAA (hGAA) region 1930 of the structure, which is directly adjacent the vGAA region 1820 of that structure.

Figure 20:
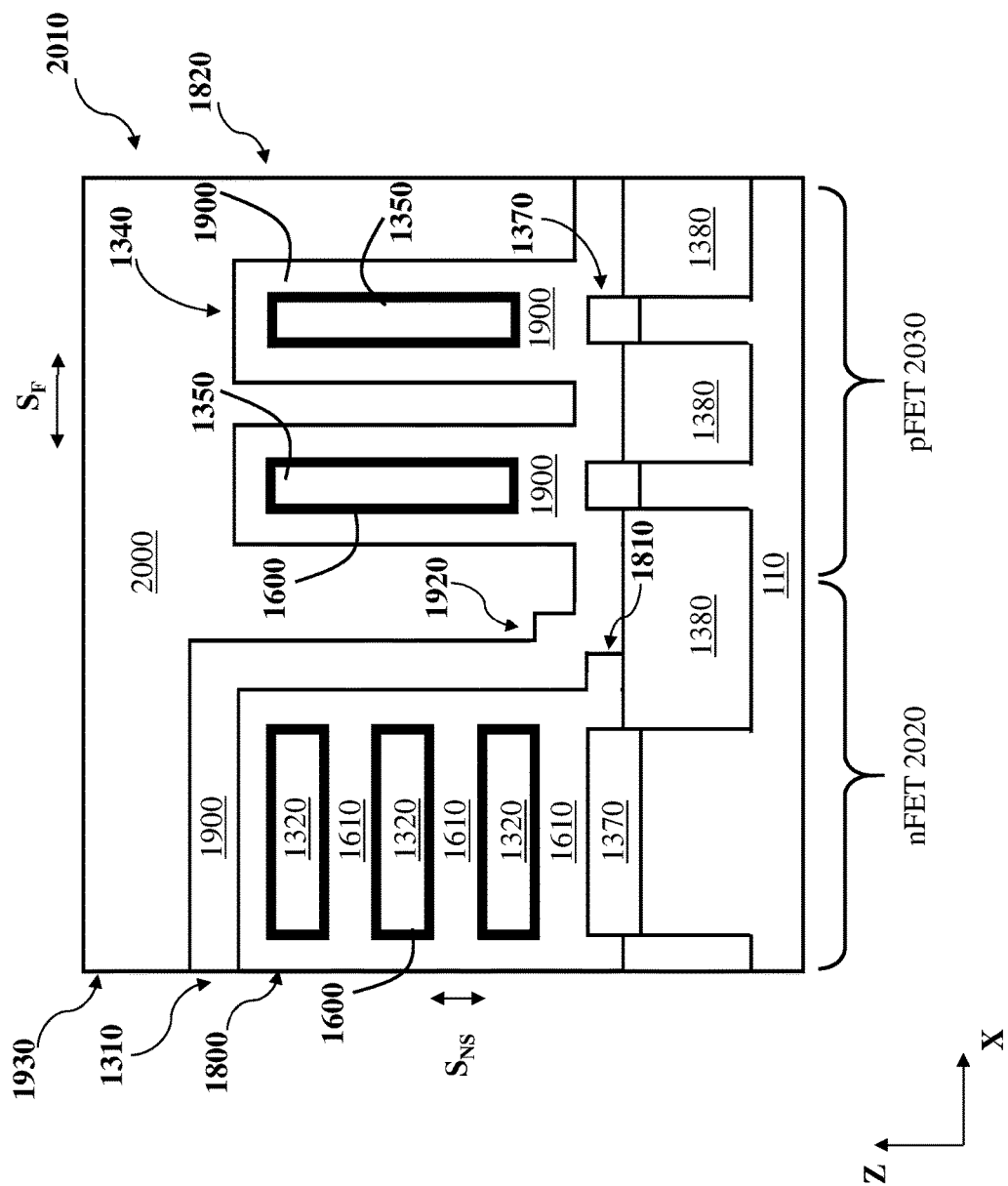
FIG. 20 illustrates a transistor structure according to embodiments of the disclosure.

FIG. 20 illustrates forming an additional work function metal 2000 over second work function metal 1900 which can include W, Co or Ru, and can be deposited or otherwise formed directly on second work function metal 1900, e.g., by CVD and a subsequent CMP process. According to various embodiments, a transistor structure 2010 formed according to the processes described herein can include the horizontally extending step 1810 in first work function metal 1610, as well as corresponding step 1920 in second work function metal 1900 (e.g., in embodiments where second work function metal 1900 is formed over first work function metal 1610). Additionally, in some cases, a spacing $S_F$ (e.g., facing edge to facing edge) spacing between adjacent fins 1340 in the set of fins is greater than a spacing $S_{NS}$ between adjacent horizontally oriented semiconductor nanosheets 1320 in nanosheet stack 1310. This spacing differential results in a narrower spacing between channels in nFET 2020 than between channels in the pFET 2030.

As shown in FIG. 20, the pFET 2030 is formed in vGAA region 1820, and adjacent nFET 2020 is formed in hGAA region 1930. In this configuration, the surface orientation of fins and nanosheets can provide greater electron and/or hole mobility when compared with conventional devices. For example, the location of pFET 2030 in the vGAA region 1820 can benefit from increased hole mobility (relative to conventional devices), as the majority of the surface orientation of the fins 1350 is in the (110) orientation. Additionally, the location of nFET 2020 in the hGAA region 1930 can benefit from increased electron mobility (relative to conventional devices), as the majority of the surface orientation of nanosheets 1320 is in the (100) orientation.

Figure 21:
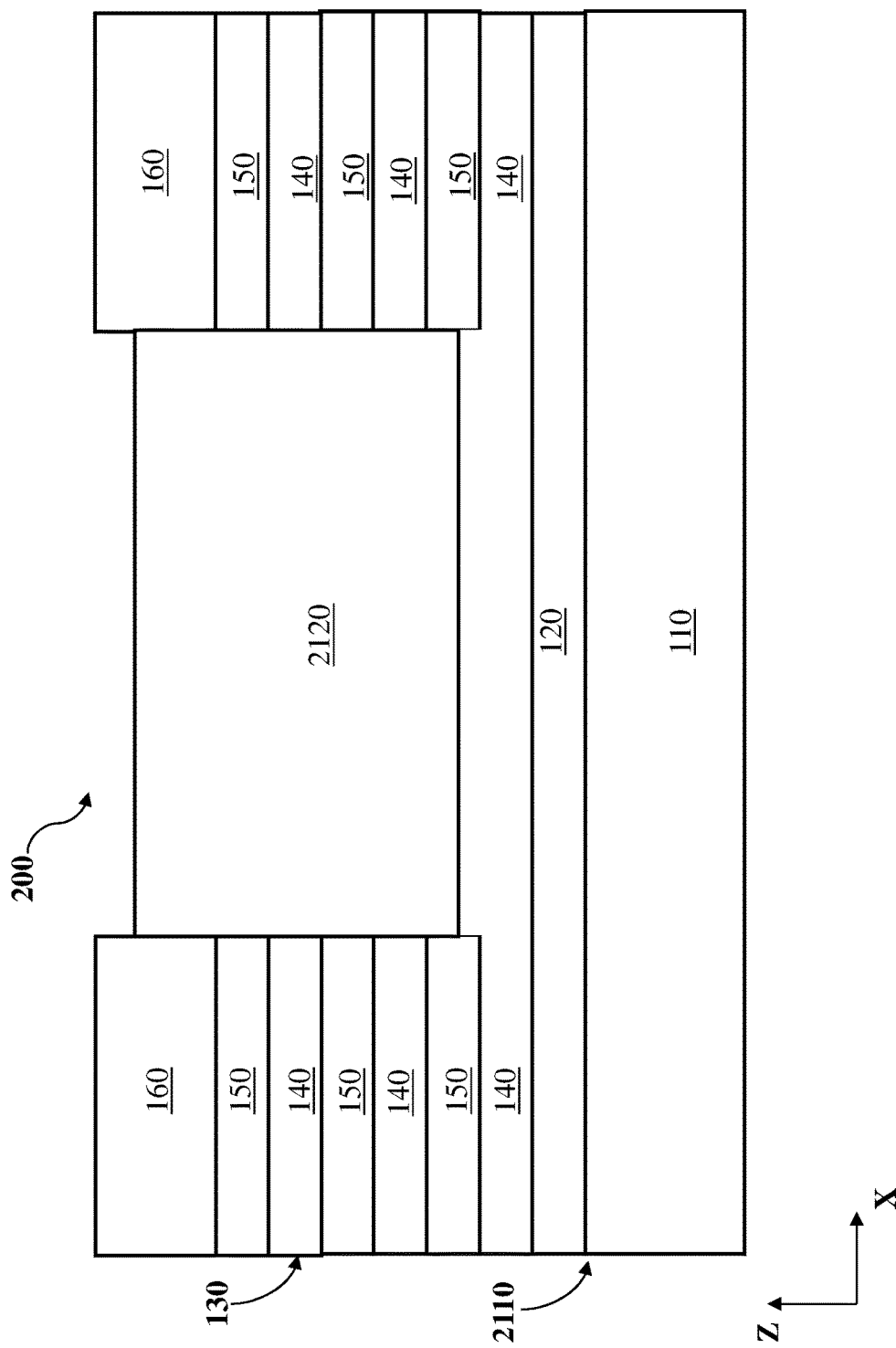
FIG. 21 illustrates an alternative process in forming a transistor structure from the precursor structure, according to embodiments of the disclosure.
Figure 22:
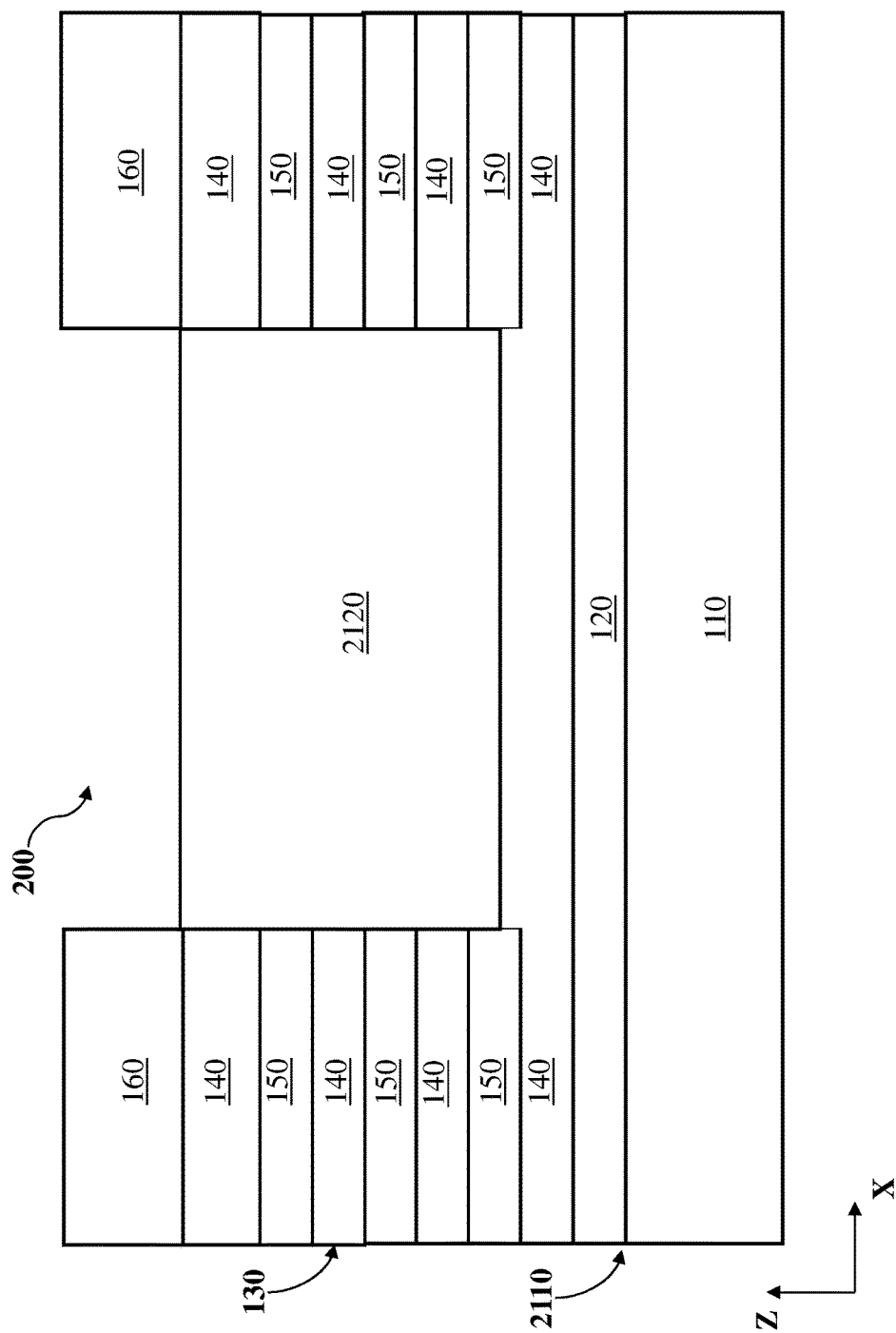
FIG. 22 illustrates another alternative process in forming a transistor structure from the precursor structure, according to embodiments of the disclosure.
Figure 23:
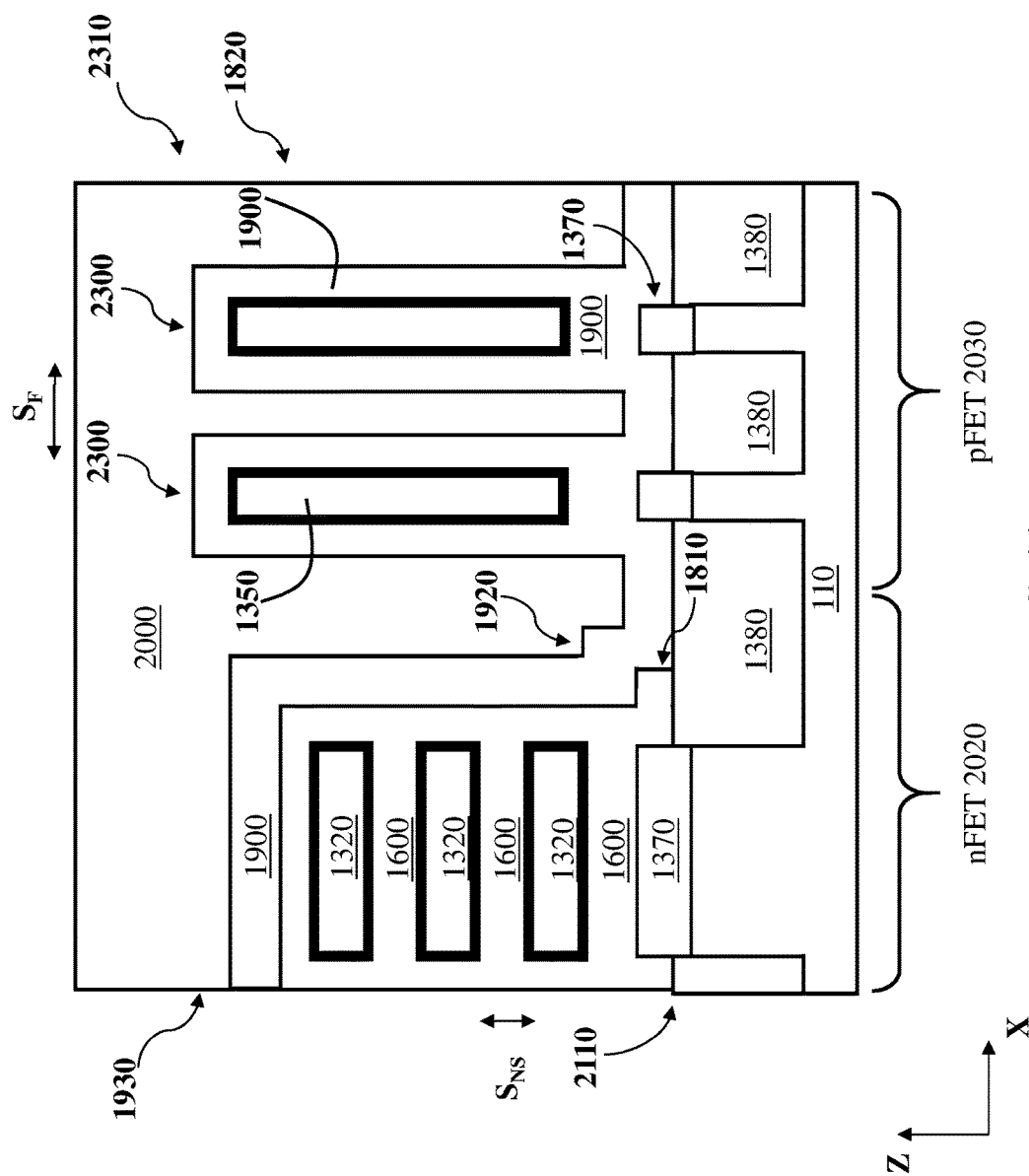
FIG. 23 illustrates a transistor structure formed from processes illustrated in FIGS. 21 and 22, according to additional embodiments of the disclosure.

FIGS. 21 and 22 illustrate two alternative approaches for forming fins 2100 with a greater height (as measured from the upper surface 2110 of substrate 110) than the nanosheet stack 1310. FIGS. 21 and 22 are alternatives to FIG. 3 in the example process flow in forming precursor structure 1300. FIG. 21 illustrates formation of silicon 2120 (similar to silicon 300 in FIG. 3) at a height equal to or greater than the upper surface of the uppermost nanosheet 150. FIG. 22 illustrates forming an additional sacrificial nanosheet 140 over uppermost nanosheet 150 in the process shown in FIG. 3. In either case, silicon 2120 formed within opening 200 extends to a greater height from the substrate (as measured from upper surface 2110) than silicon 300 illustrated in FIG. 3. Forming silicon 2120 at this height results in fins 2300 with a greater height than nanosheet stack 1310, as illustrated in the structure 2310 (e.g., GAA FET structure) in FIG. 23.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. For example, while the present disclosure describes a process related to nanosheet devices, it is anticipated that a similar process may be applied to vertically-oriented devices and/or other transistor architectures. The embodiment was chosen and described in order to best explain the principles of the disclosure and the practical application, and to enable others of ordinary skill in the art to understand the disclosure for various embodiments with various modifications as are suited to the particular use contemplated.

We claim:

1. A method of fabricating a field effect transistor (FET) comprising:
   forming a precursor structure, the precursor structure comprising:
      a nanosheet stack positioned over a substrate between a first source terminal and a first drain terminal, the nanosheet stack including at least one pair of horizontally oriented semiconductor nanosheets vertically separated by a sacrificial nanosheet; and
      at least one fin positioned over the substrate between a second source terminal and a second drain terminal, wherein the at least one fin is vertically oriented and horizontally separated from the nano sheet stack,
   selectively removing the sacrificial nanosheet to open a vertical gap between the at least one pair of semiconductor nanosheets;
   forming a first work function metal to surround the nanosheet stack and the at least one fin, the first work function metal filling the vertical gap between the at least one pair of semiconductor nanosheets;
   selectively removing the first work function metal surrounding the at least one fin while preserving an entirety of the first work function metal surrounding the nanosheet stack; and
   forming a second work function metal: over a remaining portion of the first work function metal on the nanosheet stack, and surrounding the at least one fin, wherein the first work function metal includes a different material than the second work function metal.

2. The method of claim 1, wherein the first work function metal comprises an nFET work function metal, and wherein the second work function metal comprises a pFET work function metal.

3. The method of claim 1, further comprising, after forming the first work function metal and prior to selectively removing the first work function metal:
   forming an organic planarization layer (OPL) to cover the first work function metal over the nanosheet stack, leaving a portion of the first work function metal surrounding the at least one fin exposed.

4. The method of claim 3, wherein selectively removing the first work function metal further comprises removing a portion of the first work function metal underlying the OPL without removing the first work function metal surrounding the nanosheet stack.

5. The method of claim 4, wherein removing the portion of the first work function metal underlying the OPL comprises undercut etching the portion of the first work function metal underlying the OPL.

6. The method of claim 4, further comprising removing the OPL to expose the remaining portion of the first work function metal on the nanosheet stack.

7. The method of claim 1, wherein forming the precursor structure comprises:
   forming a precursor nanosheet stack on the substrate, the precursor nanosheet stack including the at least one pair of semiconductor nanosheets and the sacrificial nanosheet therebetween;
   forming an opening within a portion of the precursor nanosheet stack above the substrate to define the nanosheet stack of the precursor structure;
   forming the at least one fin within the opening and horizontally adjacent to the nanosheet stack;
   forming a shallow trench isolation (STI) between the at least one fin and the nanosheet stack within a trench in the substrate; and
   forming a dummy gate over the nanosheet stack and the at least one fin.

8. The method of claim 7, wherein forming the precursor structure further comprises, after forming the dummy gate:
   replacing a lowermost layer of the nanosheet stack with a first isolation layer; and
   replacing a lowermost portion of the at least one fin with a second isolation layer.

9. The method of claim 7, wherein forming the at least one fin within the opening comprises:
   forming a sacrificial layer within the opening;
   epitaxially growing a p-type layer over the sacrificial layer;
   forming a silicon nitride (SiN) layer over the p-type layer; and
   etching the SiN layer, the p-type layer and the sacrificial layer to define the at least one fin within the opening.

10. The method of claim 7, wherein forming the at least one fin comprises forming two fins, and wherein forming the second work function metal surrounding the at least one fin defines a vertical gate-all-around (vGAA) PFET structure.

11. The method of claim 10, wherein forming the second work function metal over the remaining portion of the first work function metal on the nanosheet stack defines a horizontal gate-all-around (hGAA) NFET structure horizontally adjacent to the PFET structure.

12. The method of claim 11, wherein a spacing between channels in the hGAA NFET structure is narrower than a spacing between channels in the vGAA PFET structure.

13. The method of claim 1, wherein a height of the at least one fin as measured from an upper surface of the substrate is greater than a height of the nanosheet stack as measured from an upper surface of the substrate.

14. A transistor structure comprising:
a nanosheet stack positioned over a substrate between a first source terminal and a first drain terminal, the nanosheet stack including at least one pair of horizontally oriented semiconductor nanosheets, wherein the nanosheet stack defines a first channel region between the first source terminal and the first drain terminal;
a first work function metal surrounding the nanosheet stack and filling at least one vertical gap between the at least one pair of horizontally oriented semiconductor nanosheets;
a set of fins positioned over the substrate between a second source terminal and a second drain terminal, wherein the set of fins is vertically oriented and horizontally separated from the nanosheet stack; and
a second work function metal surrounding each fin in the set of fins,
wherein a spacing between adjacent fins in the set of fins is greater than a spacing between adjacent horizontally oriented semiconductor nanosheets in the nanosheet stack.

15. The transistor structure of claim 14, wherein the second work function metal overlies the first work function metal on an upper surface and a sidewall of the nanosheet stack.

16. The transistor structure of claim 15, wherein the first work function metal defines a horizontally extending step from the nanosheet stack over the substrate, and wherein the second work function metal further overlies the first work function metal at the horizontally extending step, defining a corresponding step in the second work function metal.

17. The transistor structure of claim 14, wherein the first work function metal comprises an nFET work function metal, and wherein the second work function metal comprises a pFET work function metal, wherein the nanosheet stack is located in a horizontal gate-all-around (hGAA) region of the transistor structure and wherein the set of fins is located in a vertical gate-all-around (vGAA) region of the transistor structure.

18. The transistor structure of claim 14, further comprising an additional work function metal positioned on the second work function metal.

19. The transistor structure of claim 14, further comprising:
a first isolation region positioned between the substrate and a lowermost nanosheet of the nanosheet stack; and
a second isolation region positioned between the substrate and each fin in the set of fins.

20. The transistor structure of claim 14, further comprising a shallow trench isolation (STI) positioned within the substrate horizontally between the nanosheet stack and the set of fins.

* * * * *